United States Patent
Lee et al.

(10) Patent No.: US 12,170,336 B2
(45) Date of Patent: Dec. 17, 2024

(54) OXIDE SEMICONDUCTOR TRANSISTOR, METHOD OF MANUFACTURING THE SAME, AND MEMORY DEVICE INCLUDING OXIDE SEMICONDUCTOR TRANSISTOR

(71) Applicant: Samsung Electronics Co., Ltd., Suwon-si (KR)

(72) Inventors: Kwanghee Lee, Hwaseong-si (KR); Sangwook Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 435 days.

(21) Appl. No.: 17/540,607

(22) Filed: Dec. 2, 2021

(65) Prior Publication Data

US 2022/0384656 A1 Dec. 1, 2022

(30) Foreign Application Priority Data

May 26, 2021 (KR) .................. 10-2021-0067899

(51) Int. Cl.
*H01L 29/786* (2006.01)
*H01L 21/02* (2006.01)
*H01L 29/66* (2006.01)

(52) U.S. Cl.
CPC .... *H01L 29/7869* (2013.01); *H01L 21/02565* (2013.01); *H01L 29/66969* (2013.01);
(Continued)

(58) Field of Classification Search
CPC ........... H01L 29/7869; H01L 29/78693; H01L 29/78618; H01L 29/41733; H01L 29/78648
See application file for complete search history.

(56) References Cited

U.S. PATENT DOCUMENTS 9,601,601 B2 * 3/2017 Sakata ................ H01L 29/7869
2005/0199879 A1 * 9/2005 Hoffman ............. H01L 29/7869
257/72
(Continued)

FOREIGN PATENT DOCUMENTS

| JP | 2010-219094 A | 9/2010 |
| KR | 10-2020-0069472 A | 6/2020 |
| KR | 10-2021-0013750 A | 2/2021 |

OTHER PUBLICATIONS

Yin, et al. "High Performance Low Voltage Amorphous Oxide TFT Enhancement/Depletion Inverter through Uni-/Bi Layer Channel Hybrid Integration," IEDM09-199-IEDM09-202 (2009).

Primary Examiner — Peter M Albrecht
(74) Attorney, Agent, or Firm — Harness, Dickey & Pierce, P.L.C.

(57) ABSTRACT

The present disclosure relates to oxide semiconductor transistors, methods of manufacturing the same, and/or memory devices including the oxide semiconductor transistors. The oxide semiconductor transistor includes first and second compound layers provided on a substrate, a channel layer in contact with the first and second compound layers, a first electrode facing a portion of the channel layer, a second electrode facing the first compound layer with the channel layer therebetween, and a third electrode facing the second compound layer with the channel layer therebetween. An oxygen concentration of a region of the channel layer facing the first electrode is greater than that of the remaining regions of the channel layer. A buffer layer may further be provided between the channel layer and the second and third electrodes. The first and second compound layers may include oxygen and a metal.

20 Claims, 19 Drawing Sheets

(52) U.S. Cl.
CPC .. *H01L 29/78618* (2013.01); *H01L 29/78648* (2013.01); *H01L 29/78696* (2013.01)

(56) References Cited

U.S. PATENT DOCUMENTS

| | | | |
|---|---|---|---|
| 2010/0032665 A1 | 2/2010 | Yamazaki et al. | |
| 2010/0032668 A1 | 2/2010 | Yamazaki et al. | |
| 2011/0168993 A1* | 7/2011 | Jeon | H01L 29/7869 257/43 |
| 2014/0329365 A1 | 11/2014 | Yamazaki et al. | |
| 2015/0001597 A1* | 1/2015 | Fryer | H01L 29/7869 257/288 |
| 2015/0214373 A1* | 7/2015 | Zhang | H01L 29/7869 257/72 |
| 2016/0254334 A1* | 9/2016 | Yang | H01L 29/7869 257/40 |
| 2017/0040463 A1 | 2/2017 | Kim et al. | |
| 2020/0321469 A1* | 10/2020 | Hayashi | H01L 29/7869 |

* cited by examiner

OXIDE SEMICONDUCTOR TRANSISTOR, METHOD OF MANUFACTURING THE SAME, AND MEMORY DEVICE INCLUDING OXIDE SEMICONDUCTOR TRANSISTOR

CROSS-REFERENCE TO RELATED APPLICATION

This application is based on and claims priority under 35 U.S.C. § 119 to Korean Patent Application No. 10-2021-0067899, filed on May 26, 2021, in the Korean Intellectual Property Office, the disclosure of which is incorporated by reference herein in its entirety.

BACKGROUND

Some example embodiments relate to semiconductor devices, and more particularly, to oxide semiconductor transistors and/or methods of manufacturing the same, and/or memory devices including the oxide semiconductor transistors.

With the high integration of memory devices and/or logic devices, the channel length of transistors is reduced, and thus, the reduction of an off-current is becoming important. Alternatively or additionally, an improvement of a sub-threshold swing (SS) and an on/off ratio is becoming important as characteristics for clearly distinguishing an on/off state of the transistor.

In consideration of these points, a method of utilizing an oxide semiconductor device in a memory device or a logic device, and/or a method of increasing the degree of integration by stacking an oxide semiconductor device on a silicon-based device in a low temperature process of 500° C. or less has been proposed.

In a case of an oxide semiconductor transistor, a characteristic in which a threshold voltage Vth is shifted may appear according to a subsequent process after the formation of an oxide semiconductor channel. This characteristic may be solved by a separate process, but in a process of solving the characteristic, a contact resistance may be increased.

SUMMARY

Provided are oxide semiconductor transistors capable of reducing contact resistance.

Alternatively or additionally, provided are oxide semiconductor transistors capable of removing oxygen or reducing oxygen concentration in a region of a channel layer.

Alternatively or additionally, provided are methods of manufacturing the oxide semiconductor transistors.

Alternatively or additionally, provided are memory devices including the oxide semiconductor transistors.

Additional aspects and/or features will be set forth in part in the description which follows and, in part, will be apparent from the description, and/or may be learned by practice of example embodiments of inventive concepts.

According to some example embodiments, an oxide semiconductor transistor includes, a substrate, first and second compound layers on the substrate, a channel layer contacting the first and second compound layers, a first electrode facing a portion of the channel layer, a second electrode facing the first compound layer with the channel layer between the first electrode and the second electrode, and a third electrode facing the second compound layer with the channel layer between the second electrode and the third electrode. In the channel layer, an oxygen concentration of a region facing the first electrode is greater than that of remaining regions. The oxide semiconductor transistor may further include a buffer layer between the channel layer and the second and third electrodes. In some examples, the substrate may include an insulating substrate, and the first and second compound layers may be in contact with the substrate. In some examples, the substrate may include a conductive substrate, and the first and second compound layers are separated from the substrate. In some examples, the oxide semiconductor transistor may further include an insulating layer between the substrate and the first and second compound layers. In some examples, the first and second compound layers may be provided between the channel layer and the substrate. In some examples, the channel layer may be provided between the first and second compound layers and the substrate. In some examples, the second and third electrodes may be provided between the channel layer and the substrate. In some examples, the first electrode may include a first gate electrode, and the oxide semiconductor transistor further includes a second gate electrode that is symmetrical to the first electrode with the channel layer therebetween. In some examples, the oxide semiconductor transistor may further include a gate spacer covering side surfaces of the first electrode. In some examples, the first and second compound layers may include a metal and oxygen. In some examples, portions of the channel layer contacting the first and second compound layers may not include oxygen in its entire thickness. In some examples, the first and second compound layers may include multilayers. In some examples, a gate insulating layer may be between the first electrode and the channel layer, and the gate insulating layer may extend over the second and third electrodes. Each of the second and third electrodes may include a conductive plug and a conductive layer contacting the conductive plug. In some examples, the channel layer may include an oxide semiconductor layer, and may include a single layer or a multilayer. In some examples, the first and second compound layers may include a metal having high oxygen reactivity compared to the second and third electrodes. In some examples, the metal having high oxygen reactivity may include Al, Zn, Ni, Sn, Mg, or Fe. In some examples, the metal having high oxygen reactivity may include an alloy including an element having high oxygen reactivity. The alloy may include a lithium alloy.

According to some example embodiments, a method of manufacturing an oxide semiconductor transistor may include forming, on a substrate, a channel layer having a given oxygen concentration; forming a first electrode facing a first region of the channel layer; forming a second electrode facing a second region of the channel layer; forming a third electrode facing a third region of the channel layer; and reducing the oxygen concentration in the second and third regions of the channel layer to be less than that in the first region of the channel layer through a metal-oxygen reaction. In some examples, the reducing of the oxygen concentration may include forming a metal layer contacting the second and third regions of the channel layer and including a metal having a greater oxygen reactivity than the second and third electrodes. In some examples, the metal layer may be formed between the channel layer and the substrate. In some examples, the channel layer may be formed between the metal layer and the substrate. In some examples, the method may further include forming a buffer layer between the channel layer and the second and third electrodes. In some examples, the first electrode may include a first gate electrode, and the method may further include forming a second gate electrode that is symmetrical to the first electrode with the channel layer therebetween. In some examples, the substrate may include an insulating substrate, and the metal layer may be formed to contact the substrate. In some examples, the substrate may include a conductive substrate, and the metal layer may be separated from the substrate. In some examples, the metal layer may include an alloy layer. In some examples, the method may further include forming a gate insulating layer between the first electrode and the channel layer, and extending the gate insulating layer over the second and third electrodes. In some examples, the alloy layer may include a lithium alloy. The metal layer may include a multilayer.

According to some example embodiments, a memory device includes a plurality of memory cells, wherein each of the memory cells includes a switching device, and a data storage element connected to the switching device. The switching device may include a channel layer; and a compound layer provided on one side of the channel layer and including oxygen and a metal. In some examples, the metal may include an alloy, and the alloy may include lithium. According to some example embodiments, an oxide semiconductor transistor includes, a substrate, a first and layer on the substrate, a channel layer contacting the first compound layer, a first electrode facing a portion of the channel layer, a second electrode facing the first compound layer with the channel layer between the first electrode and the second electrode, and a third electrode facing the second compound layer. In the channel layer, an oxygen density of a region facing the first electrode is greater than an oxygen density of a second that is between the first compound layer and the second electrode. An oxygen density of a third region facing the third electrode is the same as the oxygen density of the first region. In some examples, a first buffer layer may be between the second electrode and the channel layer, or a second buffer layer between the third electrode and the channel layer. In some examples, a first contact resistance between the first electrode and the channel layer is less than a second contact resistance between the second electrode and the channel layer. In some examples, there is no second compound layer on the substrate with the channel layer between the second compound layer and the second electrode.

BRIEF DESCRIPTION OF THE DRAWINGS

The above and other aspects, features, and advantages of example embodiments of inventive concepts will be more apparent from the following description taken in conjunction with the accompanying drawings, in which.

DETAILED DESCRIPTION

Figure 1:
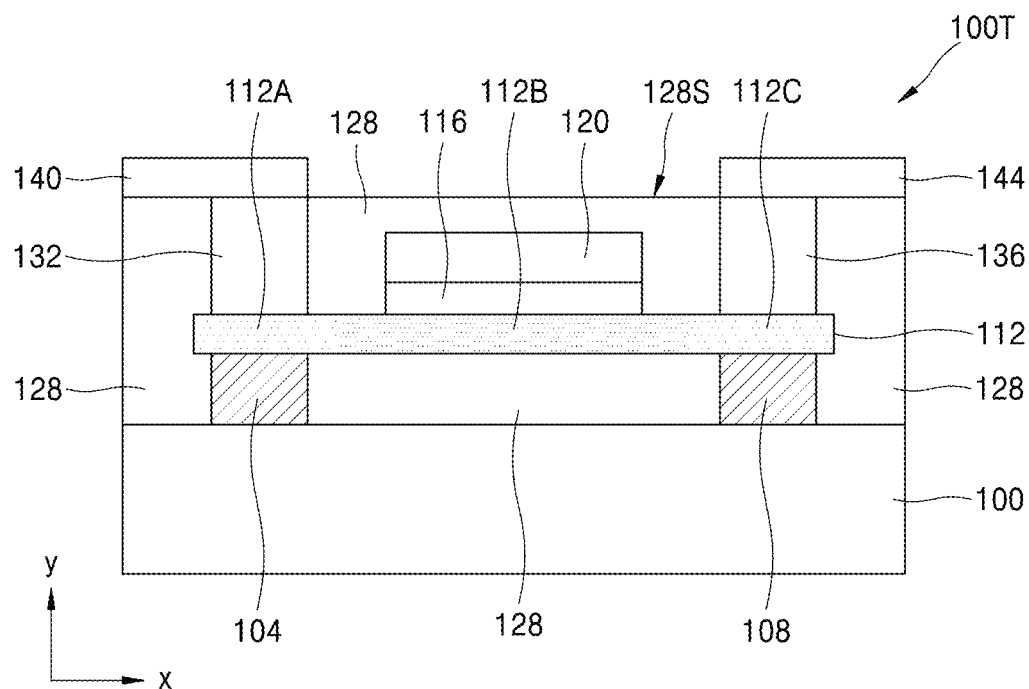
FIGS. 1 to 17 are cross-sectional views illustrating oxide semiconductor transistors according to some example embodiments.

Reference will now be made in detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. Also, it will be understood that when an element or layer is referred to as being "on" or "above" another element or layer, the element or layer may be directly on another element or layer or intervening elements or layers.

Hereinafter, oxide semiconductor transistors according to embodiments, methods of manufacturing the same, and a memory device including the oxide semiconductor transistor will be described in detail with reference to the accompanying drawings. In the drawings, thicknesses of layers and regions may be exaggerated for clarification of the specification. Also, example embodiments described below are merely illustrative, and various modifications may be possible from the embodiments of the present disclosure. In the following descriptions, like reference numerals are used to indicate like elements.

First, an oxide semiconductor transistor according to an embodiment will be described.

FIG. 1 shows an oxide semiconductor transistor (hereinafter, a first transistor 100T) according to some example embodiments. The oxide semiconductor transistor may be or may include a transistor including an oxide semiconductor layer as a channel layer.

Referring to FIG. 1, the first transistor 100T includes a first substrate 100, first and second compound layers 104 and 108 separated from each other, a channel layer 112, a gate insulating layer 116, first to third electrodes 120, 140, and 144 separated from each other, first and second conductive plugs 132, and 136 separated from each other, and an interlayer insulating layer 128. The first and second compound layers 104 and 108 may be located on a surface of the first substrate 100, for example, on an upper surface of the first substrate 100. The first and second compound layers 104 and 108 may be contacting/directly contacted the first substrate 100. The first and second compound layers 104 and 108 may have an equal height to each other. The channel layer 112 is provided on the first and second compound layers 104 and 108. The channel layer 112 is arranged on the first substrate 100 and separated from the first substrate 100. The first substrate 100, the channel layer 112, and an x-axis may be parallel to each other. The channel layer 112 is provided between the first and second conductive plugs 132 and 136 and the first and second compound layers 104 and 108. The channel layer 112 includes first to third regions 112A, 112B, and 112C. The first to third regions 112A, 112B, and 112C may be described as first to third portions. The channel layer 112 is or corresponds to a single continuous unit as a whole. Accordingly, there is no physical boundary such as a boundary between material layers between the first to third regions 112A, 112B, and 112C. The second region 112B is between the first region 112A and the third region 112C. The first to third regions 112A, 112B, and 112C may have the same thickness. The first region 112A is between the first compound layer 104 and the first conductive plug 132. The first compound layer 104, the first region 112A, and the first conductive plug 132 are sequentially stacked on the first substrate 100. The third region 112C is between the second compound layer 108 and the second conductive plug 136. The second compound layer 108, the third region 112C, and the second conductive plug 136 are sequentially stacked on the first substrate 100. The first to third regions 112A, 112B, and 112C may have material characteristics/contents different from each other. For example, the first and third regions 112A and 112C may have the same first material characteristic, and the second region 112B may have a second material characteristic that is different from the first material characteristic. In some examples, the first and second material characteristics may include an oxygen concentration. "Oxygen concentration" may also be expressed as "oxygen density", and may be determined by various analytical techniques such as but not limited to electron energy loss spectroscopy (EELS) and/or scanning tunneling microscopy. In some examples, the oxygen concentration of either or both of the first and third regions 112A and 112C may be less than the oxygen concentration of the second region 112B. For example, the oxygen vacancy of the first and third regions 112A and 112C may be greater than that of the second region 112B. In some examples, the first and third regions 112A and 112C may not include oxygen, or may include a trace amount of oxygen. The gate insulating layer 116 and the first electrode 120 are arranged on the second region 112B of the channel layer 112. The gate insulating layer 116 and the first electrode 120 are sequentially stacked. The gate insulating layer 116 may directly contact the second region 112B. The gate insulating layer 116 is between the first and third regions 112A and 112C without contacting the first and third regions 112A and 112C. The first electrode 120 may be or correspond to a gate electrode. The first electrode 120 may contact/directly contact the gate insulating layer 116 and may cover an entire upper surface of the gate insulating layer 116. The gate insulating layer 116 may be a single layer or a multilayer. When the gate insulating layer 116 is multiple layers, at least two of, or all of, the multiple layers may include the same insulating layer or different insulating layers. In some examples, the gate insulating layer 116 may include a ferroelectric layer. The gate insulating layer 116 and the first electrode 120 are arranged between the first and second conductive plugs 132 and 136. The gate insulating layer 116 and the first electrode 120 are separated from the first and second conductive plugs 132 and 136. Widths (e.g. an x-axis direction and not necessarily a transistor/channel width direction) of the first and second conductive plugs 132 and 136 may be the same, and heights (e.g. a y-axis direction) thereof may also be the same. The first conductive plug 132 is configured to face the first compound layer 104 with the first region 112A therebetween. For example, the first compound layer 104 is on an opposite side (facing) of the first conductive plug 132. The second conductive plug 136 is configured to face the second compound layer 108 with the third region 112C therebetween. For example, the second compound layer 108 is on the opposite side (facing) of the second conductive plug 136. The widths of the first conductive plug 132 and the first compound layer 104 may be equal to each other, and the widths of the second conductive plug 136 and the second compound layer 108 may be equal to each other and may or may not be equal to the widths of the first conductive plug 132 and the first compound layer 104. The interlayer insulating layer 128 is filled between the first compound layer 104, the second compound layer 108, the channel layer 112, the first conductive plug 132, the second conductive plug 136, a gate stack, that is, the gate insulating layer 116 and the first electrode 120 (hereinafter, also referred to as a gate stack 116+120), and the channel layer 112, and the first substrate 100. For example, the first transistor 100T has a shape in which the first and second compound layers 104 and 108 and the first and second conductive plugs 132 and 136 are surrounded by the interlayer insulating layer 128, and the channel layer 112 and the gate stack 116+120 are buried in the interlayer insulating layer 128. An upper surface 128S of the interlayer insulating layer 128 is flat and above the first electrode 120. The height of the upper surface of the first and second conductive plugs 132 and 136 may be the same as that of the upper surface 128S of the interlayer insulating layer 128. The second and third electrodes 140 and 144 are arranged on the interlayer insulating layer 128. One of the second and third electrodes 140 and 144 may be or correspond to a source electrode, and the other one may be or correspond to a drain electrode. The second electrode 140 may extend onto the first conductive plug 132 and cover the entire upper surface of the first conductive plug 132. The second electrode 140 may directly contact the upper surface of the first conductive plug 132. The third electrode 144 may extend onto the second conductive plug 136 and cover the entire upper surface of the second conductive plug 136. The third electrode 144 may contact/directly contact the upper surface of the second conductive plug 136. The thicknesses of the second and third electrodes 140 and 144 may be the same or different from each other. The materials of the second and third electrodes 140 and 144 may be the same or different from each other. The materials of the first conductive plug 132 and the second electrode 140 may be the same or different from each other. In some examples, the first conductive plug 132 and the second electrode 140 may include the same material, or may include materials different from each other. The materials of the second conductive plug 136 and the third electrode 144 may be the same or different from each other. In some examples, the second conductive plug 136 and the third electrode 144 may include the same material or may include materials different from each other. In some examples, the first conductive plug 132 and the second electrode 140 together may be referred to as a source electrode or a drain electrode or a source/drain electrode. In some examples, the second conductive plug 136 and the third electrode 144 together may be referred to as a source electrode or a drain electrode or a source/drain electrode.

The first substrate 100 may be or may include a non-conductive substrate. In some examples, the first substrate 100 may be an insulator substrate. In some examples, regions of the first substrate 100 contacting the first and second compound layers 104 and 108 may include an insulating layer. Therefore, no current flows between the first and second compound layers 104 and 108 through the first substrate 100. In some examples, the first substrate 100 may include a silicon oxide substrate, an aluminum oxide substrate, or a nitride substrate. In some examples, the first compound layer 104 may include oxygen and a metal, and the second compound layer 108 may also include oxygen and a metal. The entire first and second compound layers 104 and 108 may be or may include a metal oxide. In some example embodiments, the first and second compound layers 104 and 108 may only partially include a metal oxide. In the first and second compound layers 104 and 108, a region contacting the channel layer 112 may include at least a metal oxide layer. Oxygen included in the first and second compound layers 104 and 108 may be supplied from the first region 112A and the third region 112C of the channel layer 112. For example, during a manufacturing/fabrication process of the first transistor 100T, the oxygen included in the first and second compound layers 104 and 108 may be a result of reacting a metal of the first and second compound layers 104 and 108, which are in a state of a metal layer that does not include oxygen, with oxygen in the first region 112A and oxygen in the third region 112C of the channel layer 112. In some examples, the metal included in the first and second compound layers 104 and 108 may include aluminum (Al), zinc (Zn), nickel (Ni), or tin (Sn), but is not limited thereto. In some examples, the metal included in the first and second compound layers 104 and 108 may include magnesium (Mg) or iron (Fe). In some examples, the metal included in the first and second compound layers 104 and 108 may include an alloy. The alloy may include an element with high oxygen reactivity. In some examples, the element with high oxygen reactivity may be lithium (Li), but is not limited to lithium. In some examples, the alloy including lithium (Li) may include Li and a metal material capable of forming an alloy with Li. In some examples, the metal material capable of forming an alloy with Li may include Al, Si, Sn, Ag, Bi, Mg, Zn, In, Ge, Pb, Pd, Pt, Ti, or a compound thereof. The channel layer 112 may have a given (predefined or dynamically determined) thickness. When the channel layer 112 has a given thickness, during a manufacturing/fabrication process of the first transistor 100T, oxygen may be uniformly removed or reduced from the whole first and third regions 112A and 112C having the same oxygen concentration as that of the second region 112B at an initial stage of forming the channel layer 112 by a metal layer serving as an oxygen scavenger/getter formed in the locations of the first and second compound layers 104 and 108, and as a result, the oxygen concentration in the entire first and third regions 112A and 112C, may be reduced. For example, when the channel layer 112 has a given thickness, in the manufacturing process, oxygen may be removed or reduced from the whole first and third regions 112A and 112C by reacting a metal of the metal layer with oxygen in the first and third regions 112A and 112C at the initial stage of formation, and as a result, oxygen vacancies may be uniformly generated in the whole first and third regions 112A and 112C. As a result, a contact resistance between the first and second conductive plugs 132 and 136 and the first and third regions 112A and 112C of the channel layer 112 may be reduced. Accordingly, the contact resistance between the source/drain electrodes and the channel layer 112 may be reduced.

Considering the role of the metal layer, the metal layer may be variously expressed as a material layer for reducing contact resistance, a contact resistance reducing layer, an oxygen removal layer, or a material layer for reducing an oxygen concentration.

As a result of the reaction of the metal of the metal layer with oxygen in the first and third regions 112A and 112C, the metal layer may become the first and second compound layers 104 and 108. The given thickness of the channel layer 112 may be 100 nm or less, and in some examples, may be 50 nm or less, e.g. less than 20 nm. The channel layer 112 may include an oxide semiconductor layer. In some examples, the channel layer 112 may include an oxide semiconductor layer including at least one of indium (In), zinc (Zn), tin (Sn), gallium (Ga), and hafnium (Hf). In some examples, the channel layer 112 may be a single layer or a multilayer. In some examples, a material of the first and second conductive plugs 132 and 136 may be the same as that of the metal layer, but may be different from each other. In some examples, the gate insulating layer 116 may include an oxide layer or a nitride layer. In some examples, the gate insulating layer 116 may be a single layer or a multilayer. A material of the first electrode 120 may be the same as the material of the gate electrode of a field effect transistor of the related art, but may be a different conductive material from that of the gate electrode of a field effect transistor of the related art. In some examples, a material of the second and third electrodes 140 and 144 may be the same as the material of the first and second conductive plugs 132 and 136, respectively, but may be different from each other. In some examples, the interlayer insulating layer 128 may include, an oxide layer (e.g., a silicon oxide layer), but is not limited thereto.

Figure 2:
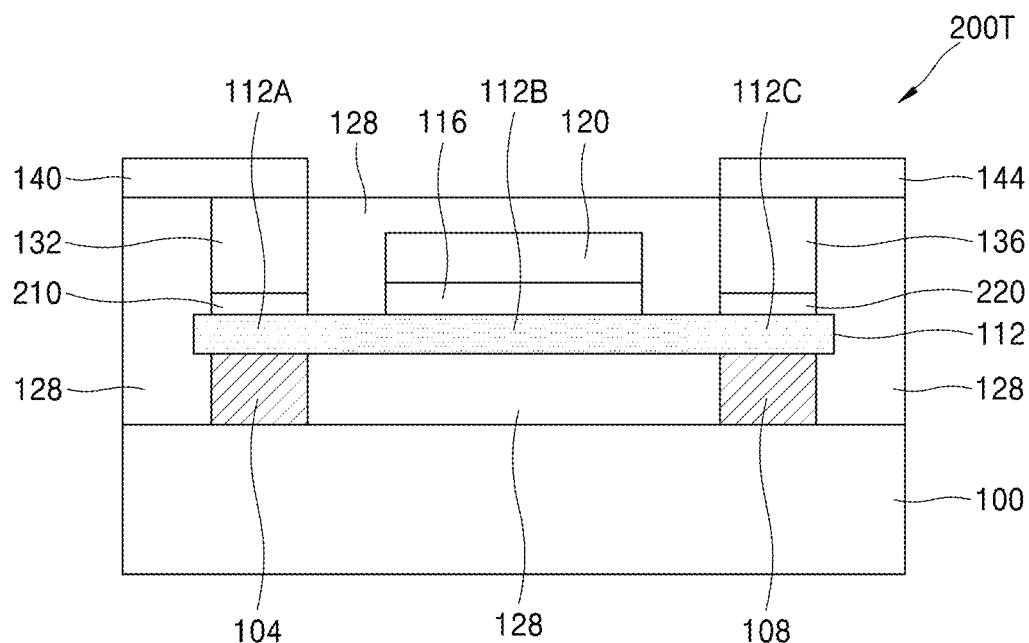

FIG. 2 shows a second oxide semiconductor transistor (hereinafter, a second transistor 200T) according to some example embodiments. Only parts different from the first transistor 100T of FIG. 1 will be described.

Referring to FIG. 2, the second transistor 200T includes a first buffer layer 210 between the first conductive plug 132 and the first region 112A of the channel layer 112 and a second buffer layer 220 between the second conductive plug 136 and the third region 112C of the channel layer 112. The first and second buffer layers 210 and 220 may include a conductive material layer, and may be or include the same or different material. The first buffer layer 210 may be a layer provided for an ohmic contact between the first conductive plug 132 and the first region 112A of the channel layer 112. The first buffer layer 210 may contact/directly contact the first conductive plug 132 and the first region 112A of the channel layer 112. The second buffer layer 220 may be a layer provided for an ohmic contact between the second conductive plug 136 and the third region 112C of the channel layer 112. The second buffer layer 220 may contact/directly contact the second conductive plug 136 and the third region 112C. The oxygen reactivity of the first and second buffer layers 210 and 220 may be lower than that of metals included in the first and second compound layers 104 and 108. In some examples, a material of the first and second buffer layers 210 and 220 may include one of a conductive oxide, an oxide including at least one of In, Ga and Zn, a two-dimensional (2D) material, and an oxide including at least one of W and TiN. In some examples, the conductive oxide may include ITO. In some examples, the 2D material may include at least one of graphene, a transition metal dichalcogenide (TMD), black phosphorus (BP) or hexagonal boron nitride (h-BN). The conductivity of the first and second buffer layers 210 and 220 may be less than the conductivity of a metal layer before becoming the first and second compound layers 104 and 108.

Figure 3:
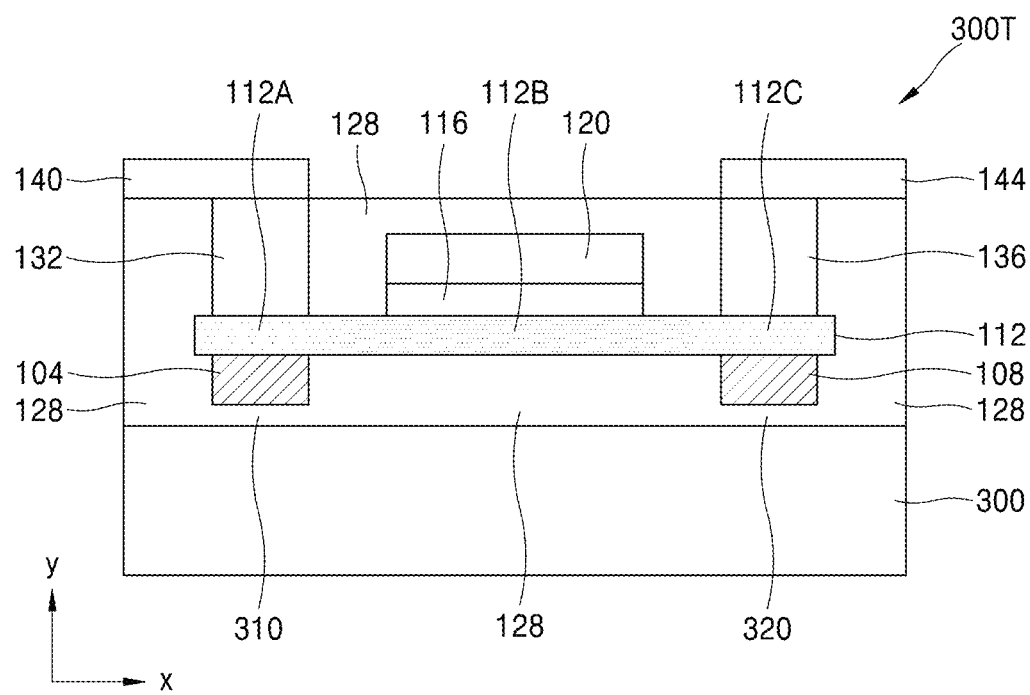

FIG. 3 shows a third oxide semiconductor transistor (hereinafter, a third transistor 300T) according to some example embodiments. Only parts different from the first transistor 100T of FIG. 1 will be described.

Referring to FIG. 3, the third transistor 300T includes a second substrate 300. In some examples, the second substrate 300 may be a conductive substrate or may include a conductive substrate. The first and second compound layers 104 and 108 are separated from the second substrate 300. A space between the first compound layer 104 and the second substrate 300 is filled with a first insulating layer 310, and a space between the second compound layer 108 and the second substrate 300 is filled with a second insulating layer 320. The first and second insulating layers 310 and 320 are connected to the interlayer insulating layer 128. The first and second insulating layers 310 and 320 may be parts of the interlayer insulating layer 128. The first and second insulating layers 310 and 320 and the interlayer insulating layer 128 may be a single unit (insulating layer) connected to each other.

Figure 4:
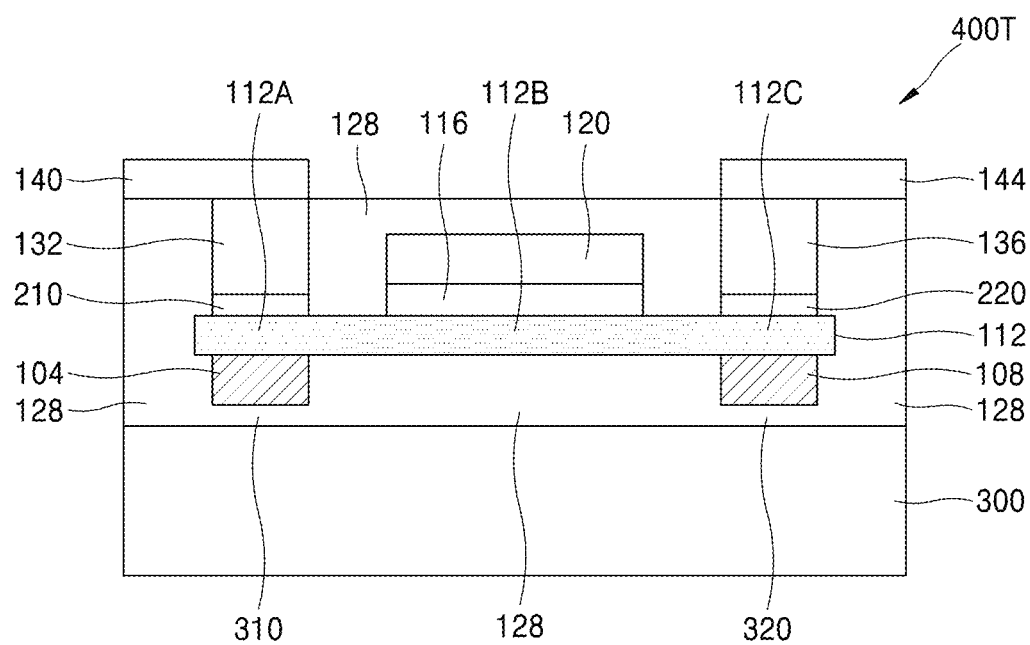

FIG. 4 shows a fourth oxide semiconductor transistor (hereinafter, a fourth transistor 400T) according to some example embodiments. Only parts different from the third transistor 300T of FIG. 3 will be described.

Referring to FIG. 4, in the fourth transistor 400T, a first buffer layer 210 is between the first region 112A of the channel layer 112 and the first conductive plug 132, and a second buffer layer 220 is between the third region 112C of the channel layer 112 and the second conductive plug 136.

Figure 5:
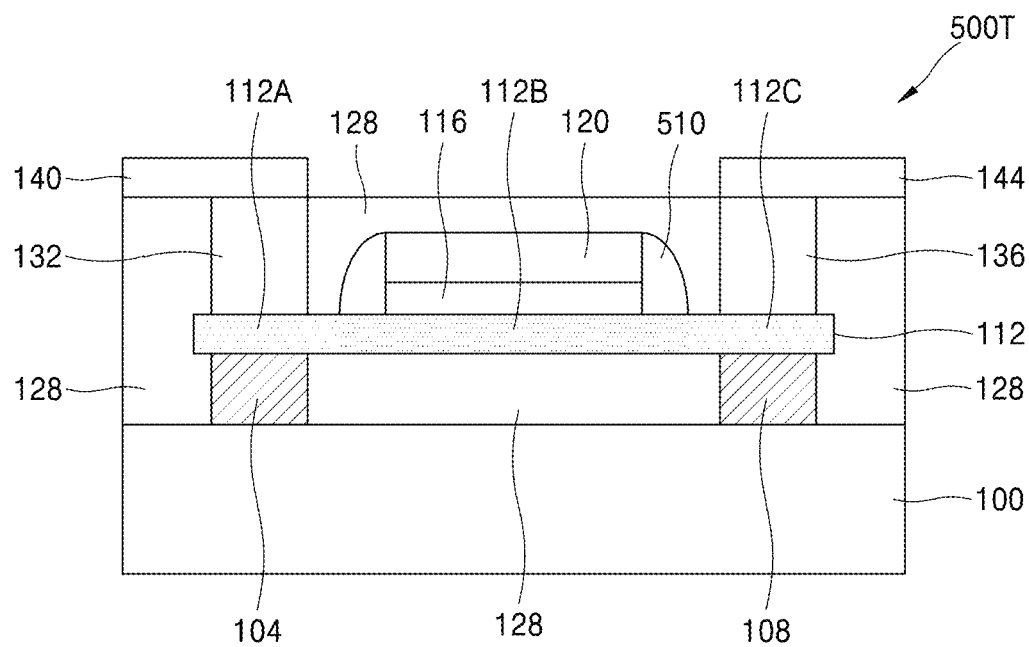

FIG. 5 shows a fifth oxide semiconductor transistor (hereinafter, a fifth transistor 500T) according to some example embodiments. Only parts different from the first transistor 100T of FIG. 1 will be described.

Referring to FIG. 5, the fifth transistor 500T includes a gate spacer 510 covering side surfaces of the gate stack 116+120. The gate spacer 510 may be formed on the second region 112B of the channel layer 112, and may cover both sides of the gate insulating layer 116 and both sides of the first electrode 120. The gate spacer 510 is between the first and second conductive plugs 132 and 136 and the gate stack 116+120 and separated from the first and second conductive plugs 132 and 136. A width of the gate spacer 510 in a direction parallel to the channel layer 112 is reduced away from the channel layer 112. The gate spacer 510 may include a nitride such as silicon nitride (Si3N4); however, example embodiments are not limited thereto.

Figure 6:
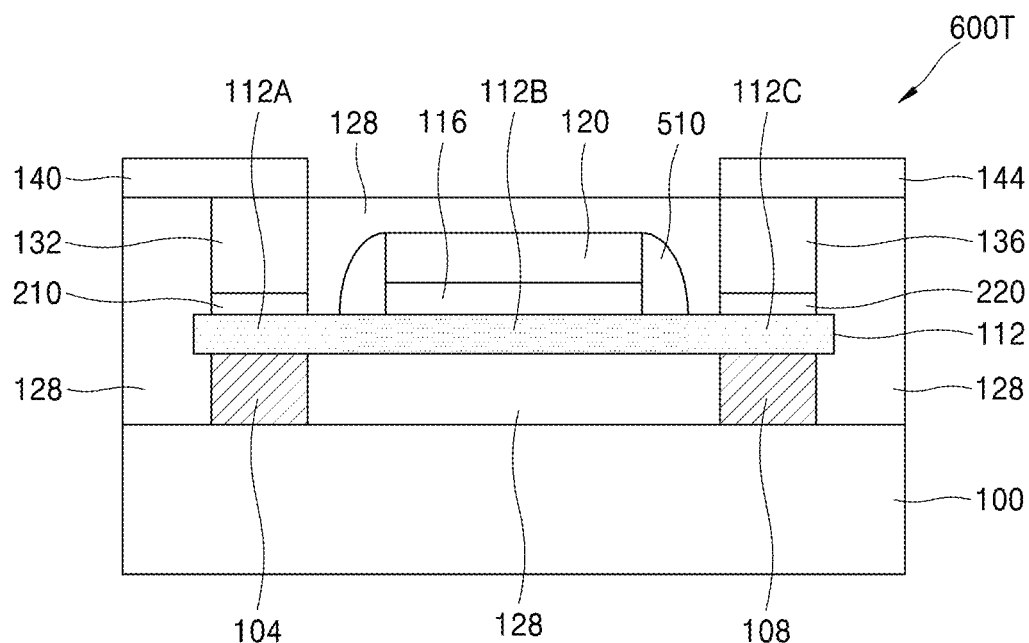

FIG. 6 shows a sixth oxide semiconductor transistor (hereinafter, a sixth transistor 600T) according to some example embodiments. The sixth transistor 600T is a combination of the second transistor 200T of FIG. 2 and the gate spacer 510 of the fifth transistor 500T of FIG. 5.

Figure 7:
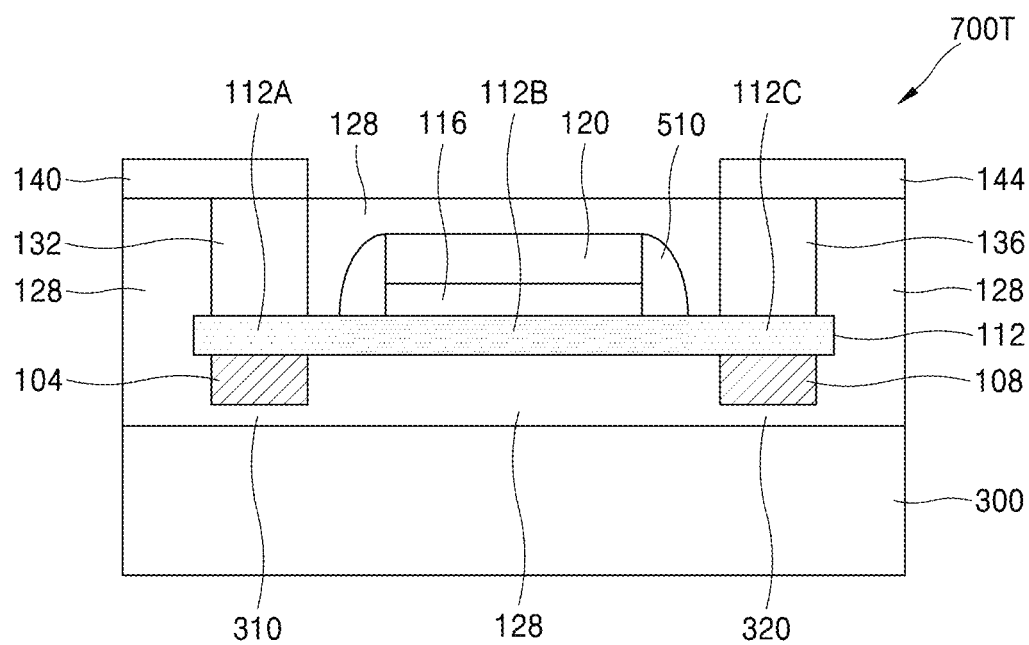

FIG. 7 shows a seventh oxide semiconductor transistor (hereinafter, a seventh transistor 700T) according to some example embodiments. The seventh transistor 700T is a combination of the third transistor 300T of FIG. 3 and the gate spacer 510 of the fifth transistor 500T of FIG. 5.

Figure 8:
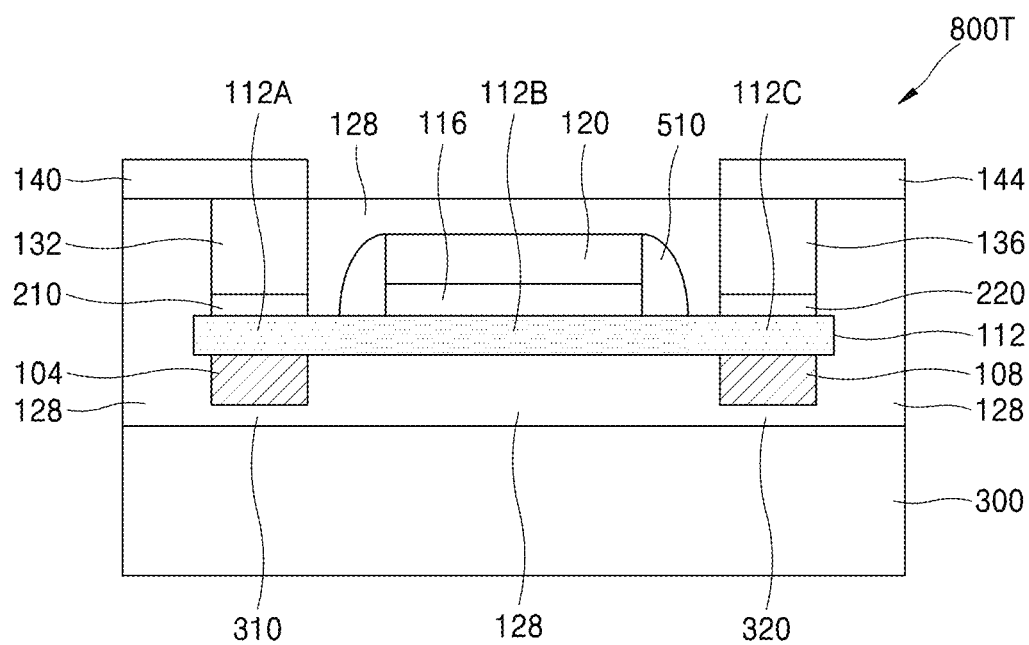

FIG. 8 shows an eighth oxide semiconductor transistor (hereinafter, an eighth transistor 800T) according to some example embodiments. The eighth transistor 800T is a combination of the fourth transistor 400T of FIG. 4 and the gate spacer 510 of the fifth transistor 500T of FIG. 5.

Figure 9:
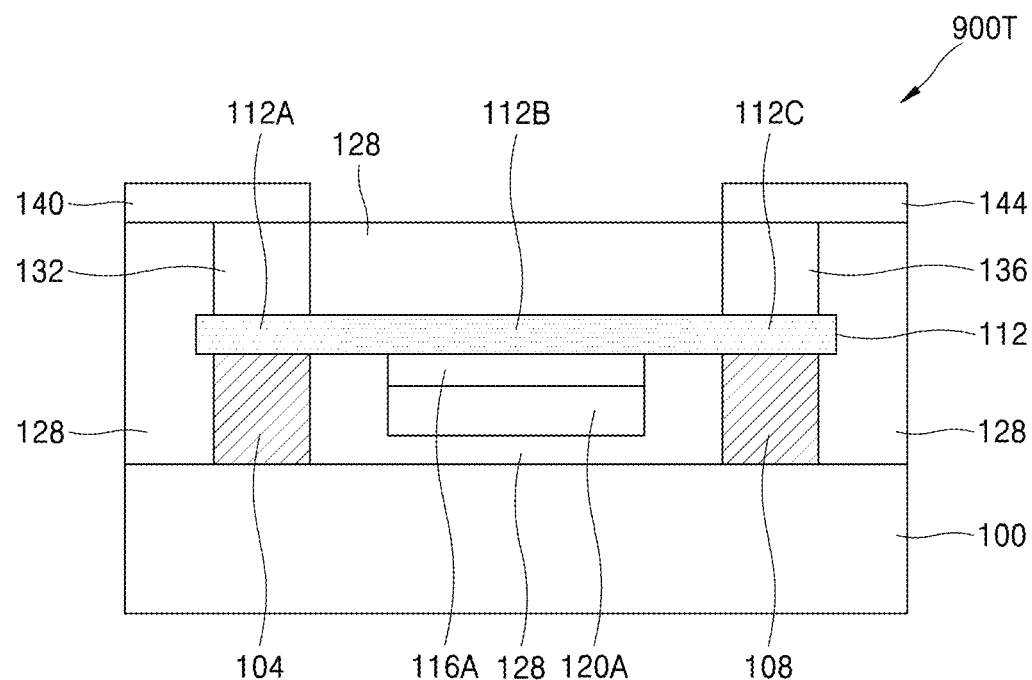

FIG. 9 shows a ninth oxide semiconductor transistor (hereinafter, a ninth transistor 900T) according to some example embodiments. Only parts different from the first transistor 100T of FIG. 1 will be described.

Referring to FIG. 9, the ninth transistor 900T may be the same as the first transistor 100T except for the location where the gate stack 116+120 is formed. Specifically, in the first transistor 100T of FIG. 1, the gate stack 116+120 is arranged on the second region 112B of the channel layer 112, whereas, in the ninth transistor 900T, a gate stack including a first gate insulating layer 116A and a first gate electrode 120A (hereinafter, referred to as a first gate stack 116A+120A) are arranged under the channel layer 112. For example, in the ninth transistor 900T, the first gate insulating layer 116A and the first gate electrode 120A are sequentially and downwardly stacked, e.g., towards the first substrate 100 on a bottom surface of the second region 112B of the channel layer 112. As a result, the gate stack 116+120 of the first transistor 100T and the first gate stack 116A+120A of the ninth transistor 900T are vertically symmetrical with respect to the channel layer 112. When the first transistor 100T is referred to as a top gate transistor, the ninth transistor 900 may be referred to as a bottom gate transistor. The ninth transistor 900T may also include the first and second buffer layers 210 and 220, like the second transistor 200T of FIG. 2.

Figure 10:
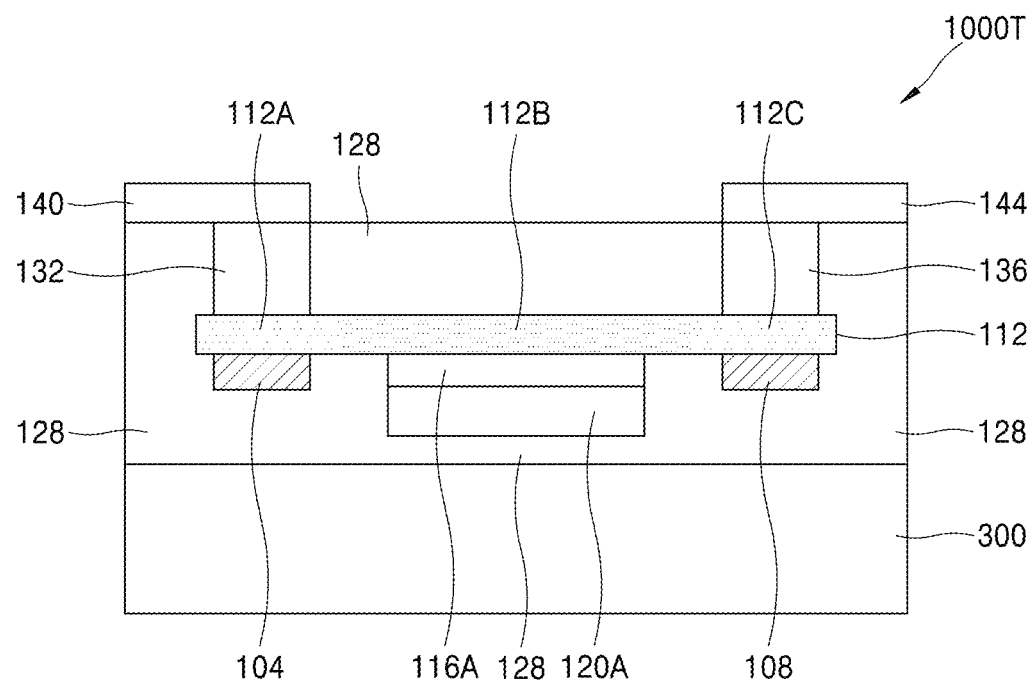

FIG. 10 shows a tenth oxide semiconductor transistor (hereinafter, a tenth transistor) 1000T) according to some example embodiments. Only parts different from the third transistor 300T of FIG. 3 will be described. The tenth transistor 1000T is a case in which the gate stack 116+120 is provided under the channel layer 112 in the third transistor 300T. In the tenth transistor 1000T, the first gate insulating layer 116A and the first gate electrode 120A are sequentially stacked toward the second substrate 300 on a bottom surface of the second region 112B of the channel layer 112. The first gate electrode 120A is separated from the second substrate 300. An interlayer insulating layer 128 is filled between the first gate electrode 120A and the second substrate 300. The tenth transistor 1000T may also include first and second buffer layers 210 and 220, like the fourth transistor 400T of FIG. 4.

Figure 11:
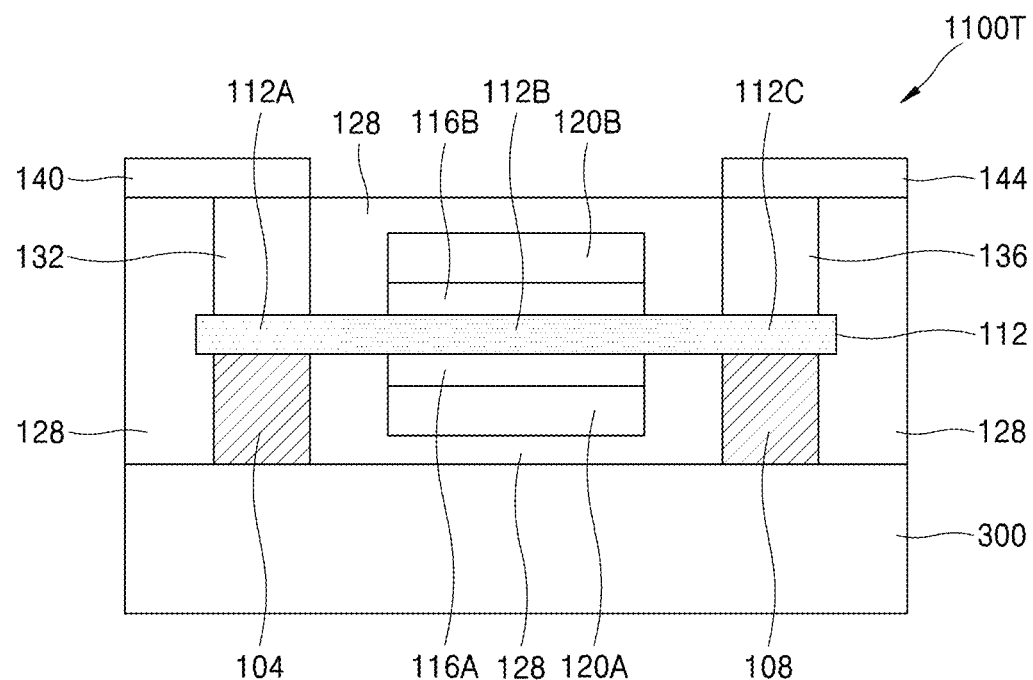

FIG. 11 shows an eleventh oxide semiconductor transistor (hereinafter, an eleventh transistor 1100T) according to some example embodiments. The eleventh transistor 1100T is a case in which the first transistor 100T of FIG. 1 is combined with the ninth transistor 900T of FIG. 9. As a result, the eleventh transistor 1100T may be a double gate transistor including two gate electrodes.

Referring to FIG. 11, the eleventh transistor 1100T includes a first gate stack 116A+120A provided below the channel layer 112 and a second gate stack 116B+120B provided on the channel layer 112. The first gate stack 116A+120A and the second gate stack 116B+120B may be vertically symmetrical with respect to the second region 112B of the channel layer 112. The first gate stack 116A+ 120A is separated from the first substrate 100. The first gate stack 116A+120A includes the first gate insulating layer 116A and the first gate electrode 120A sequentially stacked toward the lower first substrate 100 on the bottom surface of the second region 112B of the channel layer 112. The second gate stack 116B+120B includes a second gate stack 116B and a second gate electrode 120B sequentially formed on the second region 112B of the channel layer 112. In some examples, materials of the first and second gate insulating layers 116A and 116B may be the same, but may be different from each other. The materials of the first and second gate insulating layers 116A and 116B may be the same as that of the gate insulating layer 116 of the transistors described above and may be the same as, or different from, one another. In some examples, the materials of the first and second gate electrodes 120A and 120B may be the same, but may be different from each other. The materials of the first and second gate electrodes 120A, 120B may be the same as the material of the first electrode 120 of the transistors described above. The first gate stack 116A+120A and the second gate stack 116B and 120B may be buried in the interlayer insulating layer 128. The remaining parts of the eleventh transistor 1100T may be the same as that of the first transistor 100T of FIG. 1. The first and second buffer layers 210 and 220 of the second transistor 200T of FIG. 2 may be equally applied to the eleventh transistor 1100T at the same locations. Also, the gate spacer 510 of FIG. 5 may be equally applied to at least side surfaces of the second gate stack 116B+120B of the eleventh transistor 1100T.

Figure 12:
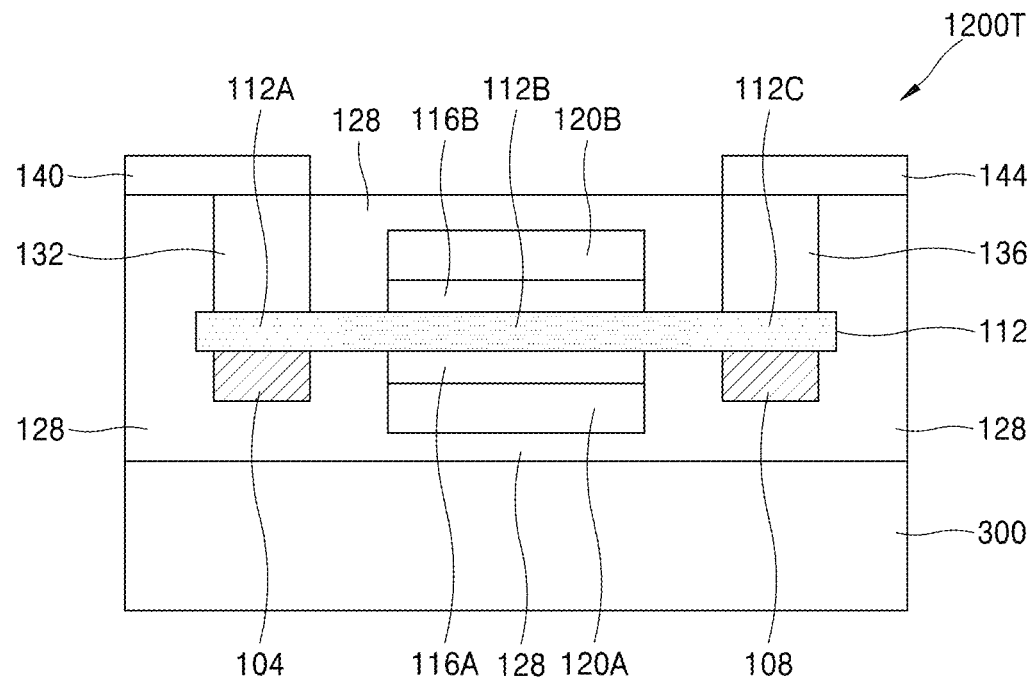

FIG. 12 shows a twelfth oxide semiconductor transistor (hereinafter, a twelfth transistor 1200T) according to some example embodiments. The twelfth transistor 1200T may be the same as a case in which the first substrate 100 is replaced with a conductive second substrate 300, the first and second compound layers 104 and 108 are separated from the second substrate 300, and the interlayer insulating layer 128 is filled between the first and second compound layers 104 and 108 and the second substrate 300 in the eleventh transistor 1100T of FIG. 11. The twelfth transistor 1200T may include a buffer layer in the same location as the first and second buffer layers 210 and 220 of the fourth transistor 400T of FIG. 4.

Figure 13:
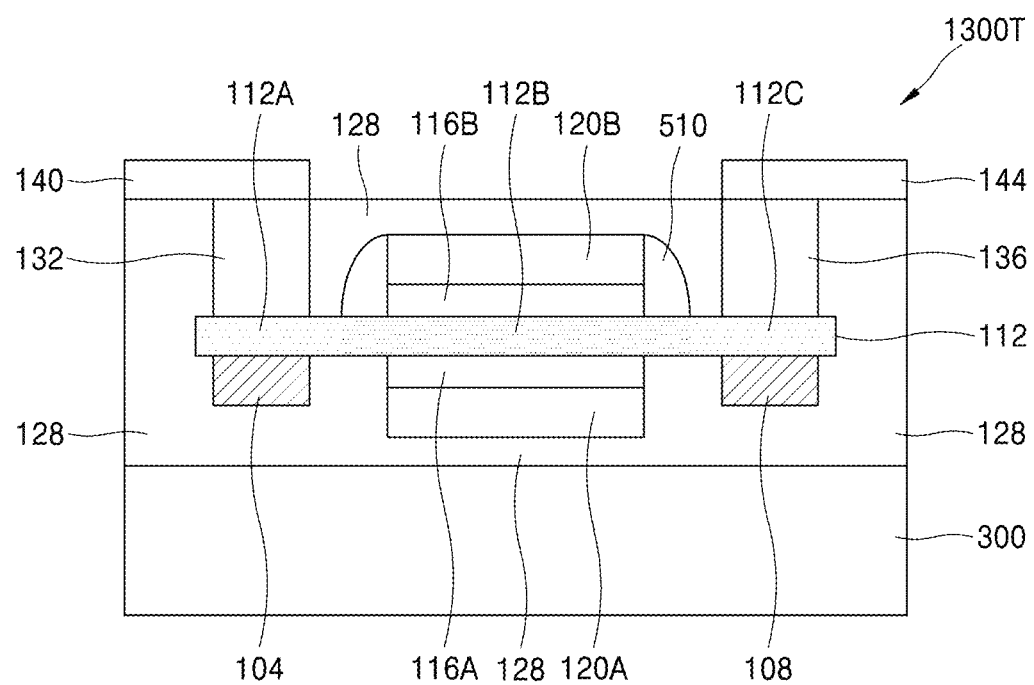

FIG. 13 shows a thirteenth oxide semiconductor transistor (hereinafter, a thirteenth transistor 1300T) according to some example embodiments. The thirteenth transistor 1300T is the same as one in which the gate spacer 510 covering the side surfaces of the second gate stack 116B+120B is provided in the twelfth transistor 1200T of FIG. 12. The thirteenth transistor 1300T may include a buffer layer in the same location as the first and second buffer layers 210 and 220 of the fourth transistor 400T of FIG. 4.

Figure 14:
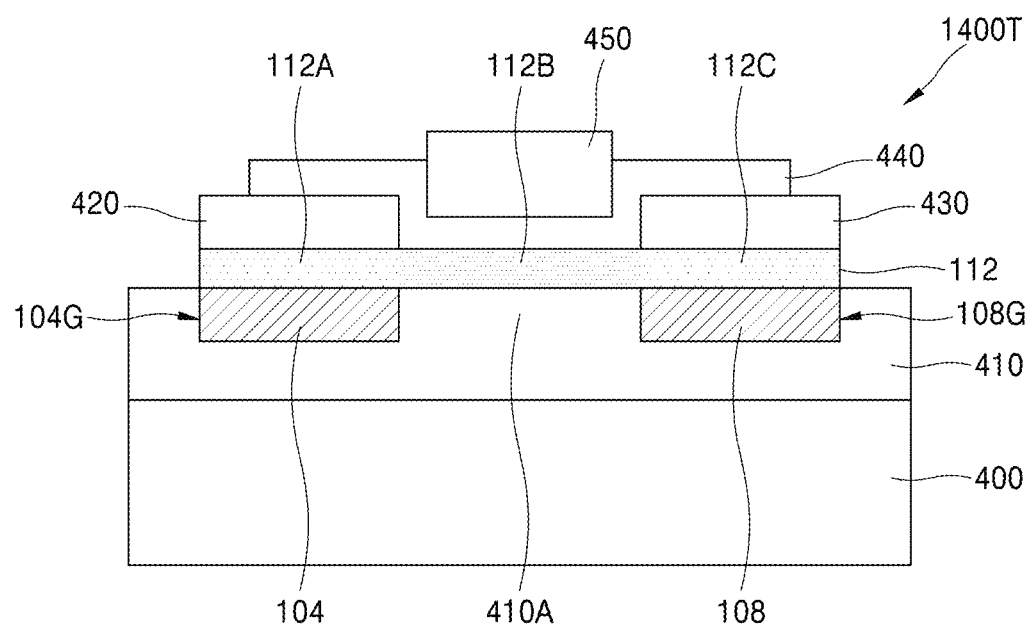

FIG. 14 shows a fourteenth oxide semiconductor transistor (hereinafter, a fourteenth transistor 1400T) according to some example embodiments.

Referring to FIG. 14, the fourteenth transistor 1400T includes a third substrate 400, an insulating layer 410, first and second compound layers 104 and 108, a channel layer 112, a source electrode 420, a drain electrode 430, a gate insulating layer 440, and a gate electrode 450. The third substrate 400 may include a conductive substrate or a non-conductive substrate. As an example, the third substrate 400 may be the first substrate 100 or the second substrate 300. The insulating layer 410 is formed on one surface of the third substrate 400. The one surface of the third substrate 400 may be an upper surface of the third substrate 400. The insulating layer 410 may cover the entire one surface of the third substrate 400 and may be in direct contact with the one surface of the substrate 400. The insulating layer 410 may include first and second grooves 104G and 108G separated from each other. The first and second grooves 104G and 108G may be respectively under the first and third regions 112A and 112C of the channel layer 112. The first and second grooves 104G and 108G may correspond to the source electrode 420 and the drain electrode 430 with the channel layer 112 therebetween, respectively. The first groove 104G is filled with the first compound layer 104. The second groove 108G is filled with the second compound layer 108. A height of an upper surface of the insulating layer 410 may be the same as the height of upper surfaces of the first and second compound layers 104 and 108. The channel layer 112 is on the insulating layer 410. The channel layer 112 covers the first and second grooves 104G and 108G and the first and second compound layers 104 and 108, and the first and third regions 112A and 112C are in direct contact with the first and second compound layers 104 and 108, respectively. A portion 410A between the first and second grooves 104G and 108G in the insulating layer 410 is covered with the second region 112B of the channel layer 112 and may be in contact/direct contact with the second region 112B of the channel layer 112. The source electrode 420 and the drain electrode 430 are on the channel layer 112 and separated from each other. The source electrode 420 is on the first region 112A of the channel layer 112, and the drain electrode 430 is on the third region 112C of the channel layer 112. The source electrode 420 and the drain electrode 430 respectively may correspond to the second electrode 140 and the third electrode 144 of the transistors described above in all aspects. The gate insulating layer 440 is arranged on the second region 112B of the channel layer 112 and extends onto the source and drain electrodes 420 and 430. For example, the gate insulating layer 440 may cover at least a portion of the source and drain electrodes 420 and 430. The material and layer configuration of the gate insulating layer 440 may be the same as those of the gate insulating layer 116 of the transistors described above, but may be different from each other. The gate electrode 450 is formed on the gate insulating layer 440 between the source electrode 420 and the drain electrode 430. The gate electrode 450 may correspond to the first electrode 120 of the transistors described above.

Figure 15:
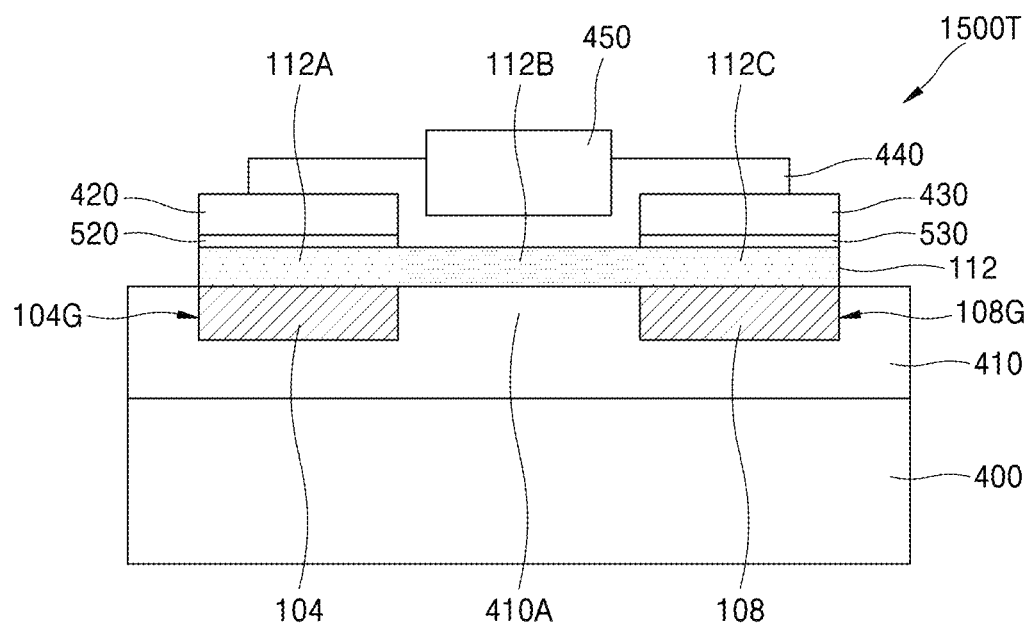

FIG. 15 shows an oxide semiconductor transistor (hereinafter, a fifteenth transistor 1500T) according to some example embodiments. Only parts different from the fourteenth transistor 1400T of FIG. 14 will be described.

Referring to FIG. 15, the fifteenth transistor 1500*t* includes a first buffer layer 520 between the first region 112A of the channel layer 112 and the source electrode 420, and a second buffer layer 530 between the third region 112C of the channel layer 112 and the drain electrode 430. The roles and/or materials of the first buffer layer 520 and the second buffer layer 530 may be the same as the roles and/or materials of the first buffer layer 210 and the second buffer layer 220 of the second transistor 200T of FIG. 2. The remaining configuration of the fifteenth transistor 1500T may be the same as that of the fourteenth transistor 1400T.

Figure 16:
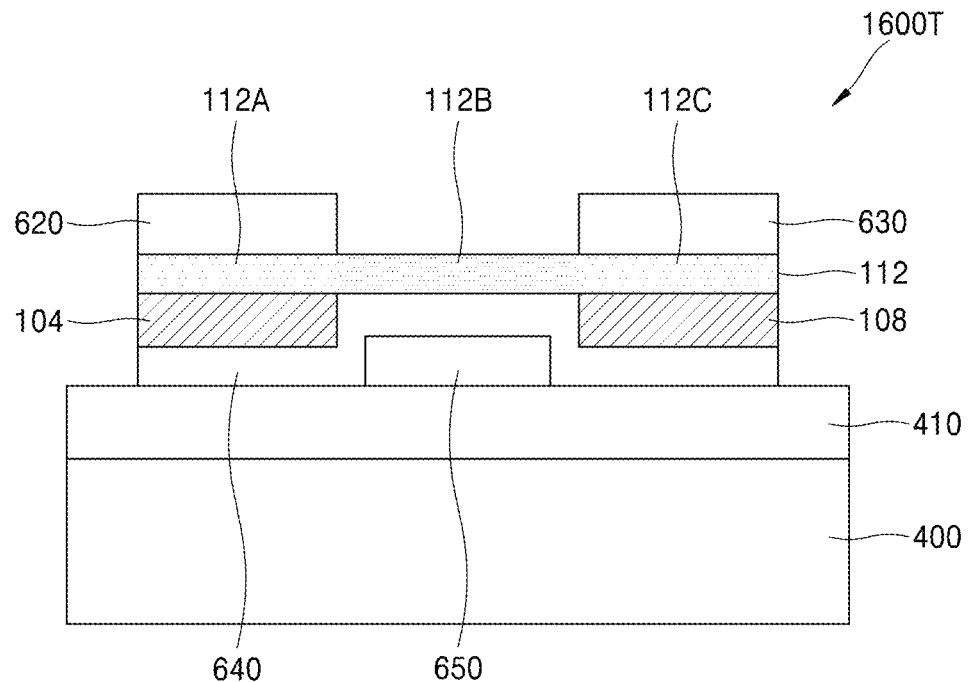

FIG. 16 shows an oxide semiconductor transistor (hereinafter, a sixteenth transistor 1600T) according to some example embodiments.

The fourteenth transistor 1400T of FIG. 14 is a top gate transistor in which the gate electrode 450 is provided above the channel layer 112, while the sixteenth transistor 1600T shown in FIG. 16 is a bottom gate transistor in which a gate electrode 650 is provided below the channel layer 112.

Specifically, referring to FIG. 16, the sixteenth transistor 1600T includes a gate insulating layer 640 and the gate electrode 650 between the channel layer 112 and the insulating layer 410. The gate electrode 650 is provided on a partial region of the gate insulating layer 640 and is contacting the gate insulating layer 640. The gate insulating layer 640 is provided on the insulating layer 410 and covers the gate electrode 650. The gate insulating layer 640 is contacting side and upper surfaces of the gate electrode 650. The gate insulating layer 640 is present between the gate electrode 650 and the first and second compound layers 104 and 108. The first compound layer 104 is provided between the first region 112A of the channel layer 112 and the gate insulating layer 640. For example, the gate insulating layer 640 extends below the first compound layer 104. For example, the gate insulating layer 640 extends between the first compound layer 104 and the substrate 400. The first compound layer 104 is contacting a bottom surface of the first region 112A of the channel layer 112 and is contacting the expanded gate insulating layer 640. The second compound layer 108 is provided between the third region 112C of the channel layer 112 and the gate insulating layer 640. The gate insulating layer 640 extends below the second compound layer 108. That is, the gate insulating layer 640 extends between the second compound layer 108 and the substrate 400. Accordingly, as in the first compound layer 104, the second compound layer 108 is formed on a partial region of the gate insulating layer 640. The second compound layer 108 is contacting the bottom surface of the third region 112C of the channel layer 112 and is contacting a portion of the gate insulating layer 640 extending under the second compound layer 108. A height of the gate insulating layer 640 formed on the gate electrode 650, that is, a portion of the gate insulating layer 640 formed under the second region 112B of the channel layer 112 may be the same as the height of the upper surface of the first and second compound layers 104 and 108 provided on both sides thereof. The channel layer 112 is formed on an upper surface of the portion of the gate insulating layer 640 formed on the gate electrode 650 and the upper surfaces of the first and second compound layers 104 and 108. The channel layer 112 may cover the entire upper surfaces of the gate insulating layer 640 and the first and second compound layers 104 and 108 and may be contacting the upper surfaces. A source electrode 620 is provided on the first region 112A of the channel layer 112 and a drain electrode 630 is provided on the third region 112C of the channel layer 112. The configuration and material of the gate electrode 650 may be the same as that of the gate electrode 450 of the fourteenth transistor 1400T of FIG. 14. The material and layer configuration of the gate insulating layer 640 may be the same as those of the gate insulating layer 440 of the fourteenth transistor 1400T. The source electrode 620 and the drain electrode 630 may also be the same as the source and drain electrodes 420 and 430 of the fourteenth transistor 1400T.

As the first and second buffer layers 520 and 530 are provided in the fifteenth transistor 1500T of FIG. 15, a buffer layer may be provided between the source electrode 620 and the first region 112A and between the drain electrode 630 and the third region 112C of the sixteenth transistor 1600T, respectively.

Figure 17:
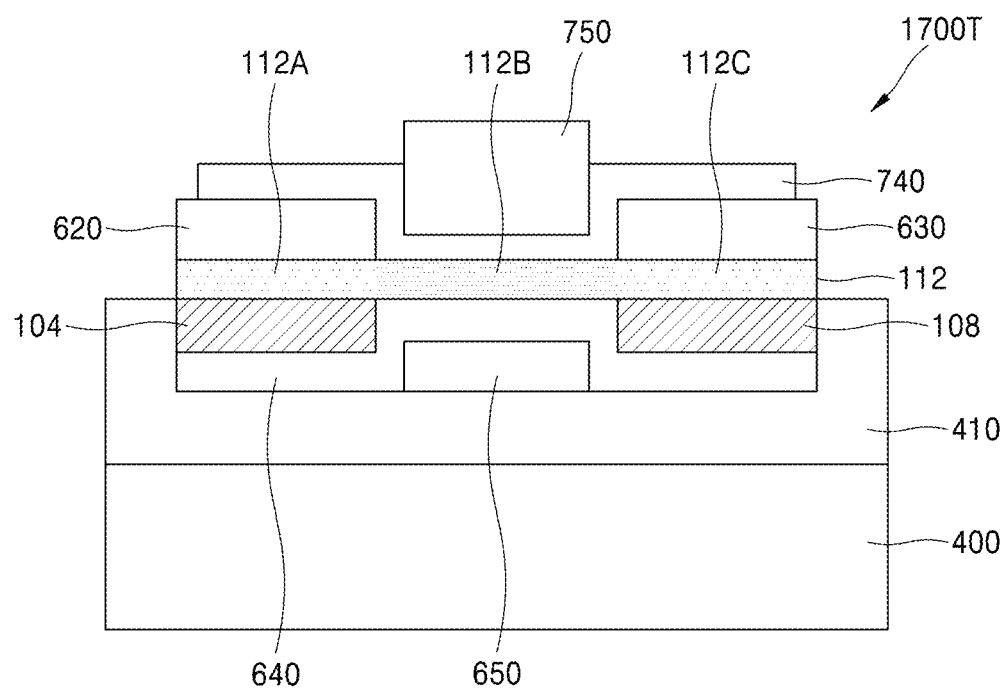

FIG. 17 shows an oxide semiconductor transistor (hereinafter, a seventeenth transistor 1700T) according to some example embodiments. The seventeenth transistor 1700T is a double gate transistor in which gate electrodes 650 and 750 are provided above and below the channel layer 112, respectively. Only parts different from the sixteenth transistor 1600T of FIG. 16 will be described.

Referring to FIG. 17, a second gate insulating layer 740 is provided on the channel layer 112. The second gate insulating layer 740 is formed on the second region 112B of the channel layer 112 between the source electrode 620 and the drain electrode 630, and extends on the source and drain electrodes 620 and 650. Side and upper surfaces of the source and drain electrodes 620, 630 may be covered with the second gate insulating layer 740 and may be contacting the second gate insulating layer 740. The material of the second gate insulating layer 740 may be the same as the gate insulating layer 640 formed under the channel layer 112, but may be different from each other. The gate insulating layer 640 and the second gate insulating layer 740 may be provided to be vertically symmetrical with respect to the channel layer 112. A second gate electrode 750 is on the second gate insulating layer 740. The second gate insulating layer 740 is between the second gate electrode 750 and the source and drain electrodes 620 and 630, and thus, the second gate electrode 750 and the source and drain electrodes 620 and 630 are not contacting each other. The gate electrode 650 and the second gate electrode 750 may be formed to be vertically symmetrical with respect to the channel layer 112. The material of the second gate electrode 750 may be the same as the gate electrode 650, but may be different from each other.

Figure 18:
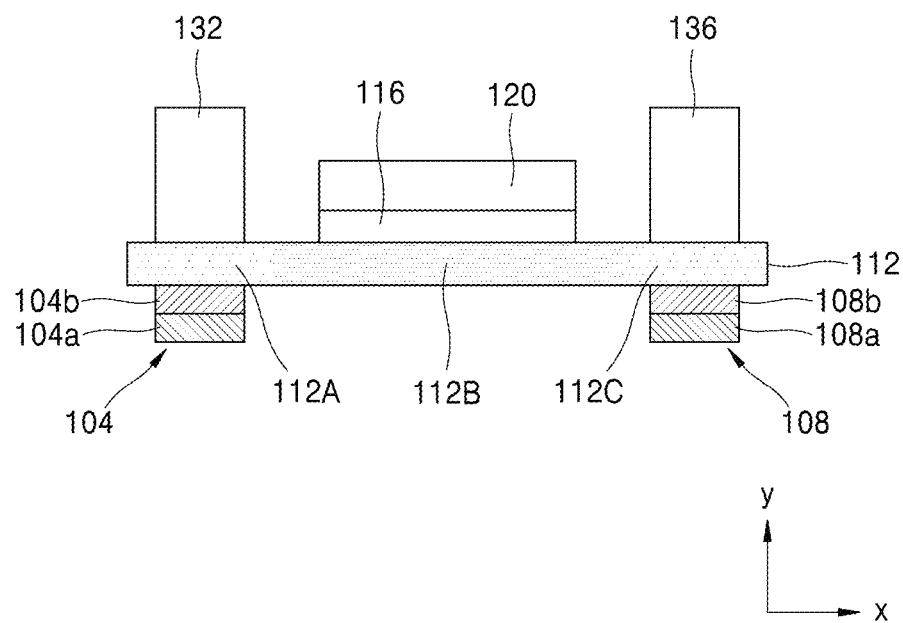
FIG. 18 is a schematic cross-sectional view of a case in which first and second compound layers are multilayers in the oxide semiconductor transistors of FIGS. 1 to 17.

In the first to seventeenth transistors 100T to 1700T described above, the first and second compound layers 104 and 108 may be a single layer, but may also be a multilayer as shown in FIG. 18.

Referring to FIG. 18, the first compound layer 104 includes a first material layer 104a and a second material layer 104b sequentially stacked, and the second compound layer 108 may also include a first material layer 108a and a second material layer 108b sequentially stacked. The first and second material layers 104a and 104b of the first compound layer 104 may include oxygen, and may be layers having different material compositions from each other. In some examples, metal components included in the first and second material layers 104a and 104b may be different from each other. The first and second material layers 108a and 108b of the second compound layer 108 may include oxygen, and may have different material compositions from each other. In some examples, metal components included in the first and second material layers 108a and 108b may be different from each other. In some examples, the metal components of the first and second material layers 104a and 104b of the first compound layer 104 may be the same, but oxygen content may be different from each other. For example, the oxygen content of the second material layer 104b contacting the first region 112A of the channel layer 112 may be greater than that of the first material layer 104a that is not contacting the second region 112A. In some examples, the metal components of the first and second material layers 108a and 108b of the second compound layer 108 may be the same, but oxygen content may be different from each other. For example, the oxygen content of the second material layer 108b contacting the third region 112C of the channel layer 112 may be greater than that of the first material layer 108a that is not contacting the third region 112C. The oxygen content may be regarded as oxygen concentration or oxygen density.

In FIG. 18, although it is depicted that the first compound layer 104 and the second compound layer 108 include two material layers, respectively, each of the compound layers 104 and 108 may include two or more layers and may include the same or a different number of layers.

Figure 19:
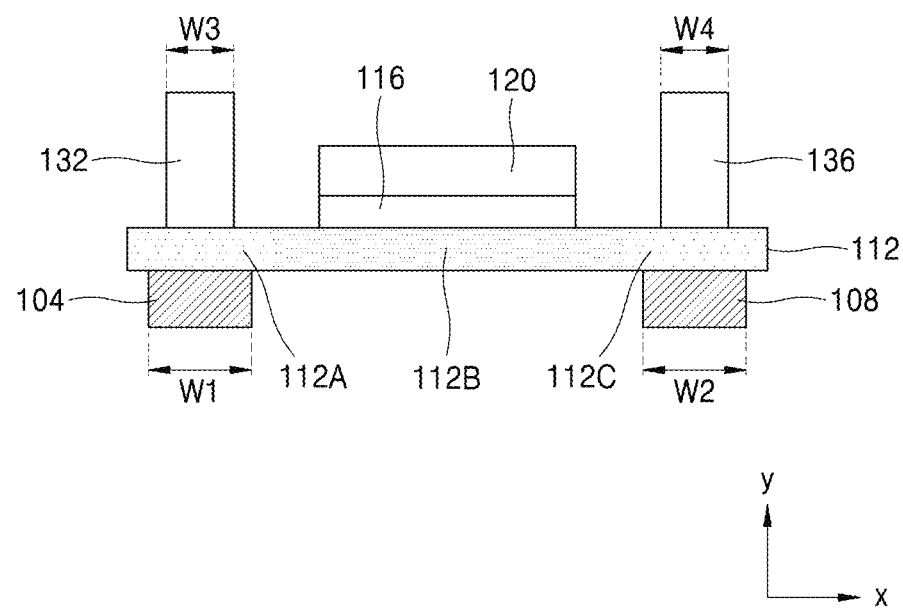
FIG. 19 is a schematic cross-sectional view of a case in which a width of the first and second compound layers in the oxide semiconductor transistors shown in FIGS. 1 to 17 is different from a width of source and drain electrodes.

In some examples, in the first to seventeenth transistors 100T to 1700T, as shown in FIG. 19, the widths of the first and second compound layers 104 and 108 and the widths of the first and second conductive plugs 132 and 136 may be different from each other.

Referring to FIG. 19, the first compound layer 104 may have a first width W1, and the second compound layer 108 may have a second width W2 that is greater than or less than the first width. The first conductive plug 132 may have a third width W3, and the second conductive plug 136 may have a fourth width W4 that is greater than or less than the third width W3. In some examples, the first and second widths W1 and W2 may be the same or different from each other. In some examples, the third and fourth widths W3 and W4 may be the same or different from each other. In some examples, the first width W1 may be greater than the third width W3. In some examples, the second width W2 may be greater than the fourth width W4.

Figure 20:
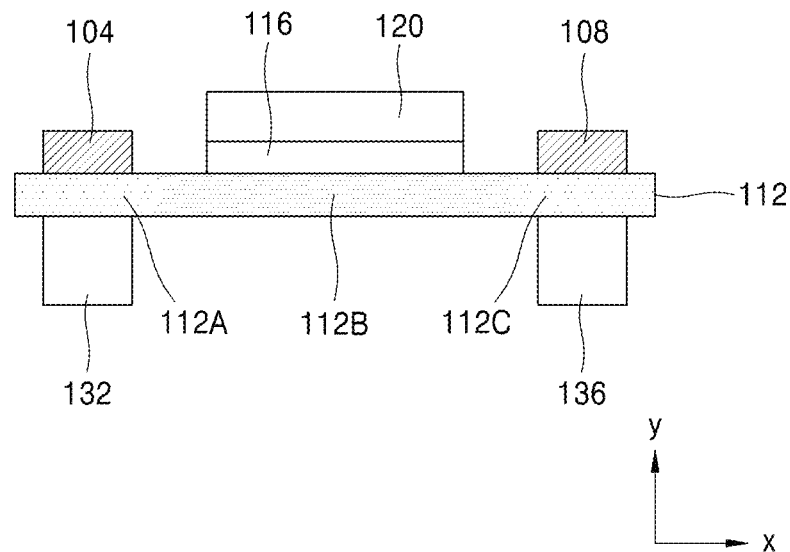
FIG. 20 is a schematic cross-sectional view of a case in which the first and second compound layers are provided on a channel layer in the oxide semiconductor transistors shown in FIGS. 1 to 17, and a case in which the source and drain electrodes are provided under the channel layer.

In the first to seventeenth transistors 100T to 1700T, the first and second compound layers 104 and 108 and the first and second conductive plugs 132 and 136 may be arranged at different locations while maintaining a corresponding relationship with each other. As an example, as shown in FIG. 20, the first and second compound layers 104 and 108 may be arranged on the channel layer 112, and the first and second conductive plugs 132 and 136 may be arranged under the channel layer 112. For example, the first conductive plug 132 may be arranged under the first region 112A of the channel layer 112 and contact the bottom surface of the first region 112A, and the first compound layer 104 may be arranged on the first region 112A of the channel layer 112 and contact the upper surface of the first region 112A. In addition, the second conductive plug 136 may be arranged under the third region 112C of the channel layer 112 and contact the bottom surface of the third region 112C, and the second compound layer 104 may be arranged on the third region 112C and contact the upper surface of the third region 112C. The characteristics of the transistors described with reference to FIGS. 18 and 19 may be applied to the transistor shown in FIG. 20.

Next, a method of manufacturing an oxide semiconductor transistor according to some example embodiments will be described. In the following description, the same reference numerals as referred to the descriptions of the transistors described above indicate the same members, and the descriptions thereof will be omitted.

FIGS. 21 to 29 show a method of manufacturing an oxide semiconductor transistor having a top gate structure.

Figure 21:
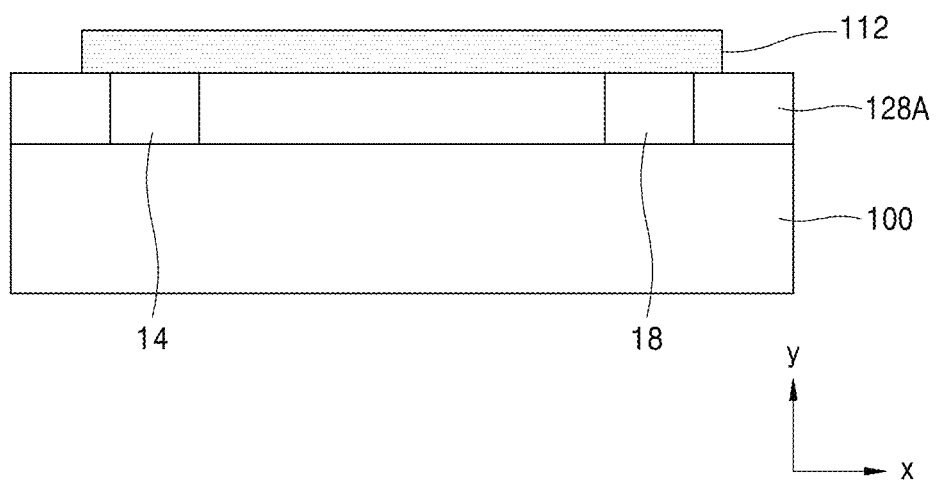
FIGS. 21 to 34 are cross-sectional views illustrating methods of manufacturing oxide semiconductor transistors according to embodiments.

Referring to FIG. 21, first and second metal layers 14 and 18 are formed on a substrate 100. The first and second metal layers 14 and 18 may be formed to be separated from each other. The first and second metal layers 14 and 18 may be formed to have the same thickness. In some examples, materials of the first and second metal layers 14 and 18 may be the same or different from each other. The first and second metal layers 14 and 18 may have a greater oxygen reactivity or oxygen reactivity than the source and drain electrodes to be formed in the subsequent process. For example, the first and second metal layers 14 and 18 may include a material capable of reacting and combining with oxygen more easily than the source and drain electrodes. In some examples, the first metal layer 14 may include Al, Zn, Ni, Sn, Mg, or Fe, but is not limited thereto. In some examples, the first metal layer 14 may include an alloy including an element having a high oxygen reactivity. In some examples, the element may be lithium (Li), and the alloy may be a lithium alloy. The lithium alloy may include lithium as described above, and may include a metal capable of forming an alloy with lithium. In some examples, the material of the second metal layer 18 may be the same as the material of first metal layer 14, but may be different from each other. The first and second metal layers 14 and 18 may be formed with a physical vapor deposition (PVD) process and/or a chemical vapor deposition (CVD) process; however, example embodiments are not limited thereto.

After the first and second metal layers 14 and 18 are formed, a first interlayer insulating layer 128A is formed on the substrate 100 around the first and second metal layers 14 and 18. The first interlayer insulating layer 128A may cover an entire upper surface of the substrate 100 on which the first and second metal layers 14 and 18 are formed. The first interlayer insulating layer 128A described above may be obtained such that, after forming the first interlayer insulating layer 128A covering the first and second metal layers 14 and 18 on the substrate 100, an upper surface of the formed first interlayer insulating layer 128A is planarized, e.g. with a chemical mechanical planarization (CMP) process and/or an etchback process. The planarization may be performed until the first and second metal layers 14 and 18 are exposed. In some examples, the first interlayer insulating layer 128A may be formed by using a silicon oxide, and is not limited to the silicon oxide.

Figure 22:
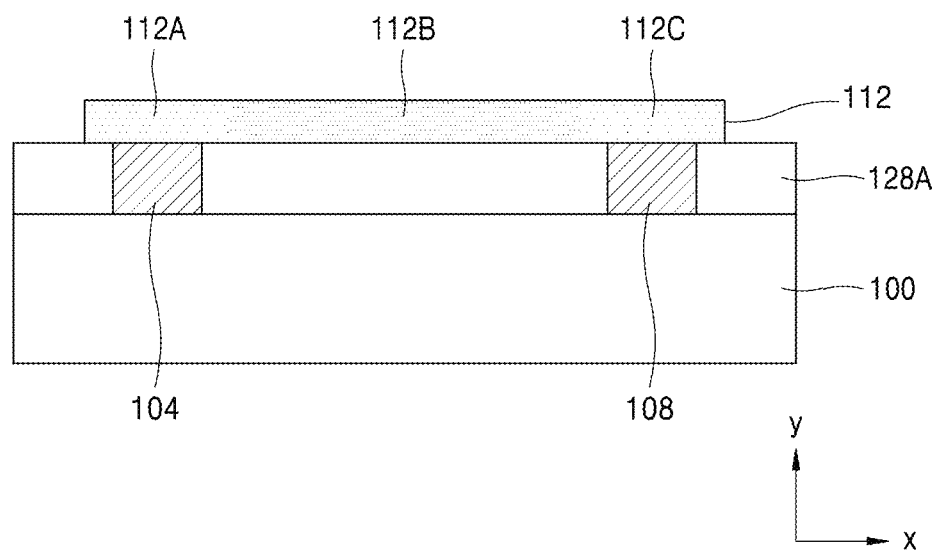

Next, a channel layer 112 is formed on the first interlayer insulating layer 128A. The channel layer 112 may be formed to cover the entire first interlayer insulating layer 128A between the first and second metal layers 14 and 18 and the entire first and second metal layers 14 and 18. The channel layer 112 may contact the first and second metal layers 14 and 18. The channel layer 112 may be formed to a given thickness. In some examples, the channel layer 112 may be formed to have a thickness according to which oxygen is removed in a thickness direction (a y-axis direction) of the channel layer 112 from the entire region of the channel layer 112 contacting the first and second metal layers 14 and 18. For example, the channel layer 112 may be formed to a thickness of 100 nm or less, to a thickness of 50 nm or less, and to a thickness of 20 nm or less. In some examples, the channel layer 112 may include an oxide semiconductor layer. Immediately after the channel layer 112 is formed, an oxygen concentration of the channel layer 112 may be uniform throughout the channel layer 112. The oxygen concentration may be represented by oxygen density and/or oxygen content. After the channel layer 112 is formed, oxygen in a region of the channel layer 112 contacting the first and second metal layers 14 and 18 is moved to the first and second metal layers 14, 18, and reacts with/absorbs a metal in the first and second metal layers 14 and 18. Accordingly, in the channel layer 112, the oxygen concentration of the region contacting the first and second metal layers 14 and 18 is less than the oxygen concentration in a region not contacting the first and second metal layers 14 and 18, that is, in a region between the first and second metal layers 14 and 18. Due to the contact between the channel layer 112 and the first and second metal layers 14 and 18, the first and second metal layers 14 and 18 become first and second compound layers including oxygen, respectively. FIG. 22 shows a result in which, after the channel layer 112 is formed, according to the contact between the channel layer 112 and the first and second metal layers 14 and 18, the regions of the channel layer 112 contacting the first and second metal layers 14 and 18 are changed into the first and third regions 112A and 112C having a low oxygen concentration, and the first and second metal layers 14 and 18 are changed into the first and second compound layers 104 and 108 by reacting with oxygen in the channel layer 112. In FIG. 22, the second region 112B is a region not contacting the first and second metal layers 14 and 18 and has a greater oxygen concentration than the first and third regions 112A and 112C.

Figure 23:
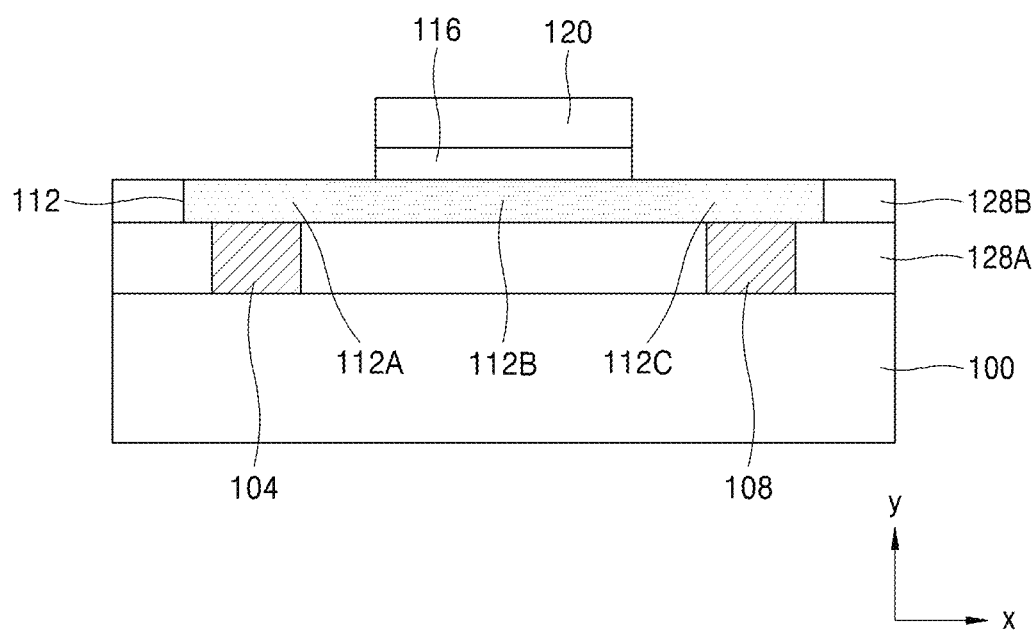

After the channel layer 112 is formed, as shown in FIG. 23, a second interlayer insulating layer 128B is formed on the first interlayer insulating layer 128A around the channel layer 112. The second interlayer insulating layer 128B may be formed to cover the entire first interlayer insulating layer 128A around the channel layer 112. In some examples, a height of an upper surface of the second interlayer insulating layer 128B may be the same or substantially the same as the height of an upper surface of the channel layer 112. The second interlayer insulating layer 128B of this type may be formed such that, after forming the second interlayer insulating layer 128B covering the channel layer 112 on the first interlayer insulating layer 128A, the upper surface of the formed second interlayer insulating layer 128B is planarized. The planarization may be performed until the channel layer 112 is exposed. In some examples, the second interlayer insulating layer 128B may include the same material as the first interlayer insulating layer 128A, but may include a different insulating material layer. The first and second metal layers 14 and 18, the first and second interlayer insulating layers 128A and 128B, and the channel layer 112 may be formed by at least one of an atomic layer deposition (ALD), a chemical vapor deposition (CVD), a physical vapor deposition (PVD), sputter, etc., and may be formed by other known deposition methods, and may be formed at the same or different times.

Next, a gate insulating layer 116 and a first electrode 120 as a gate electrode are sequentially stacked on the second region 112B of the channel layer 112. This type of gate insulating layer 116 and the first electrode 120 may be formed such that, after sequentially forming the gate insulating layer 116 and the first electrode 120 on the channel layer 112 and the second interlayer insulating layer 128B, the formed first electrode 120 and the gate insulating layer 116 are patterned by using a patterning process. In some examples, the patterning process may include sequentially forming the gate insulating layer 116 and the first electrode 120 on the channel layer 112 and the second interlayer insulating layer 128B, forming a mask (not shown) defining the second region 112B of the channel layer 112 on the first electrode 120, sequentially removing the first electrode 120 and the gate insulating layer 116 around the mask, and removing the mask.

Figure 24:
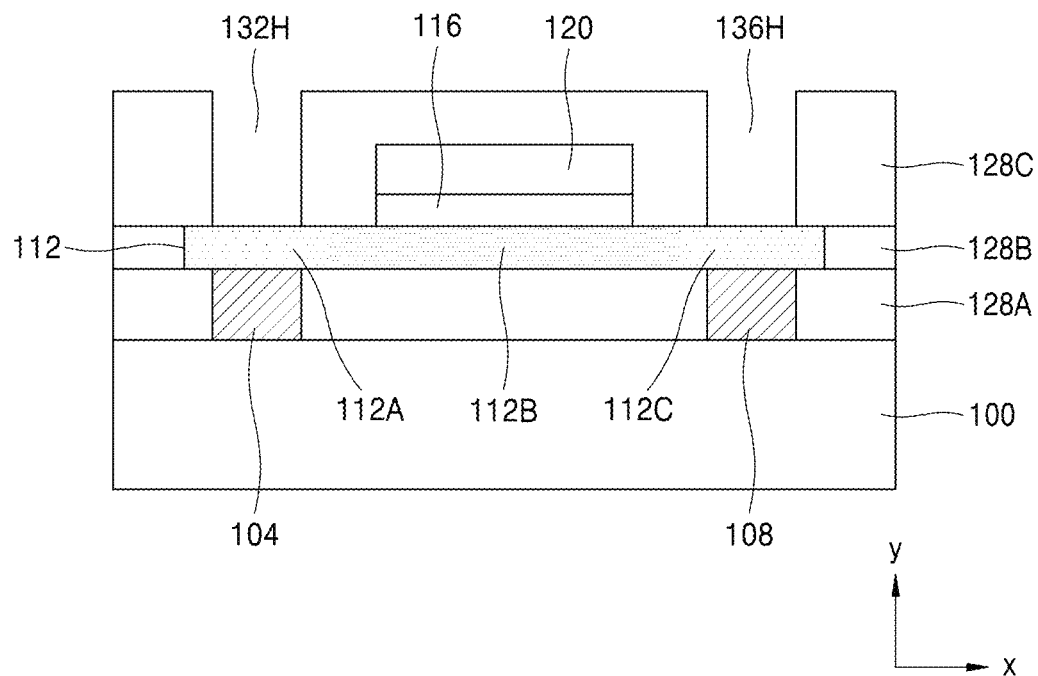

Next, as shown in FIG. 24, a third interlayer insulating layer 128C covering a gate stack 116+120 is formed on the channel layer 112 and the second interlayer insulating layer 128B. An upper surface of the third interlayer insulating layer 128C is formed to be flat. The upper surface of the third interlayer insulating layer 128C is above the first electrode 120 and is separated from the first electrode 120. The third interlayer insulating layer 128C may include the same insulating material as the first interlayer insulating layer 128C, but may include a different insulating material. When the first to third interlayer insulating layers 128A, 128B, and 128C include the same material, the first to third interlayer insulating layers 128A, 128B, and 128C become one interlayer insulating layer, and may correspond to the interlayer insulating layer 128 of the transistors described above. After the third interlayer insulating layer 128C is formed, first and second via holes 132H and 136H separated from each other are formed in the third interlayer insulating layer 128C. The first and second via holes 132H and 136H may be formed to have the same depth. The first via hole 132H is on the first region 112A of the channel layer 112. The first region 112A is exposed through the first via hole 132H. The first via hole 132H may be formed directly on the first compound layer 104 with the first region 112A of the channel layer 112 therebetween. That is, the first via holes 132H may be formed to face the first compound layer 104 with the first region 112A of the channel layer 112 therebetween. The second via hole 136H is on the third region 112C of the channel layer 112. The third region 112C may be exposed through the second via hole 136H. The second via hole 136H may be formed directly on the second compound layer 108 with the third region 112C therebetween. That is, the second via hole 136H may be formed at a location facing the second compound layer 108 with the third region 112C of the channel layer 112 therebetween. Widths of the first and second via holes 132H and 136H may be the same as the widths of the first and second compound layers 104 and 108.

Figure 25:
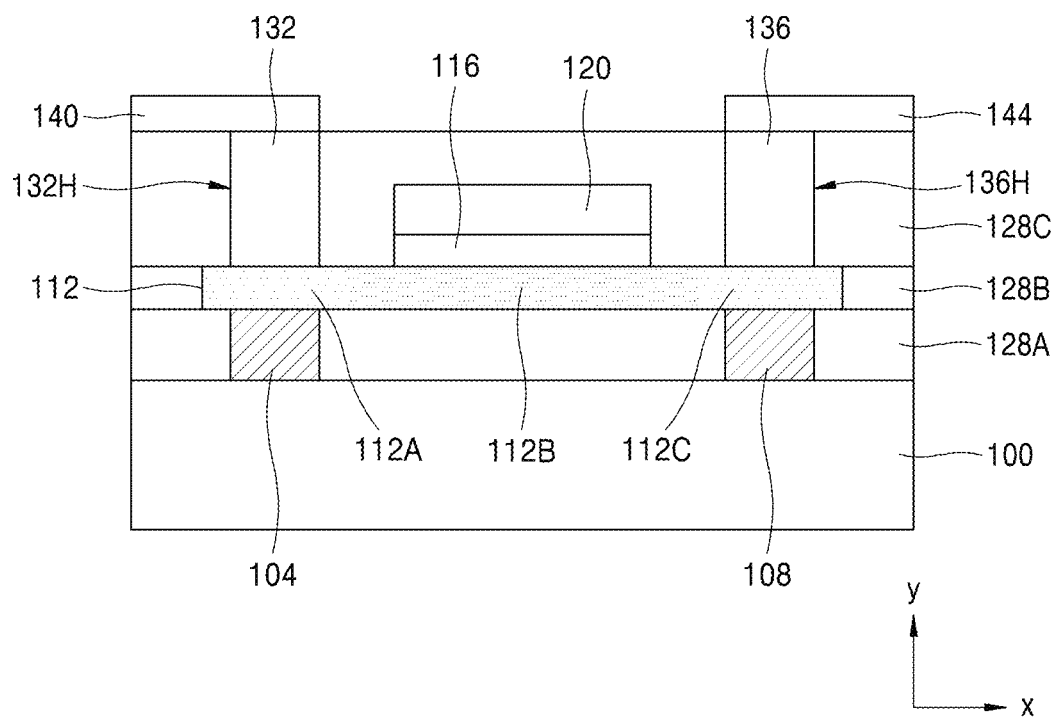

Next, as shown in FIG. 25, the first via hole 132H is filled with a first conductive plug 132, and the second via hole 136H is filled with a second conductive plug 136. The first and second conductive plugs 132 and 136 may be conductive layers or include the conductive layers. In some examples, the first and second conductive plugs 132 and 136 may include a substance having a relatively low oxygen reactivity than the first and second metal layers 14 and 18. Accordingly, the first and second conductive plugs 132 and 136 may include a material different from that of the first and second metal layers 14 and 18. In some examples, as a result of a metal oxygen reaction due to the contact between the channel layer 112 and the first and second metal layers 14 and 18, if an oxygen concentration in the first and third regions 112A and 112C of the channel layer 112 is too low to make any more metal-oxygen reaction, or when oxygen is completely removed from the first and third regions 112A and 112C, the first and second conductive plugs 132 and 136 may include the same material as the first and second metal layers 14 and 18. After completely filling the first and second via holes 132H and 136H with the first and second conductive plugs 132 and 136, respectively, second and third electrodes 140 and 144 separated from each other are formed on the third interlayer insulating layer 128C. In some examples, the second electrode 140 may be a source electrode and may be formed contacting an upper surface of the first conductive plug 132. The second electrode 140 may be formed to be extended on the upper surface of the first conductive plug 132, and may be formed to cover the entire upper surface of the first conductive plug 132. In some examples, the second electrode 140 may include the same material as the first conductive plug 132, but may include other conductive materials. When the second electrode 140 and the first conductive plug 132 include the same material, a process of forming the first conductive plug 132 and the second electrode 140 may include a process of forming a conductive layer filling the first via hole 132H on the third interlayer insulating layer 128C and a process of patterning the formed conductive layer. That is, the first conductive plug 132 and the second electrode 140 may be formed through the process of forming the conductive layer and the process of patterning the conductive layer.

In some examples, the third electrode 144 may be a drain electrode and may be formed contacting an upper surface of the second conductive plug 136. The third electrode 144 may be formed to be extended onto the upper surface of the second conductive plug 136. The third electrode 133 may be formed to cover the entire upper surface of the second conductive plug 136.

In some examples, the third electrode 144 may include the same material as the second electrode 140. In some examples, the third electrode 144 may include the same material as the second conductive plug 136, but may include other conductive materials. When the third electrode 144 and the second conductive plug 136 include the same material, a process of forming the second conductive plug 136 and the third electrode 144 may include a process of forming a conductive layer filling the second via hole 136H on the third interlayer insulating layer 128C and a process of patterning the formed conductive layer. That is, the second conductive plug 136 and the third electrode 144 may be formed through the process of forming the conductive layer and the process of patterning the conductive layer. As a result, a transistor corresponding to the first transistor 100T of FIG. 1 may be formed.

Figure 26:
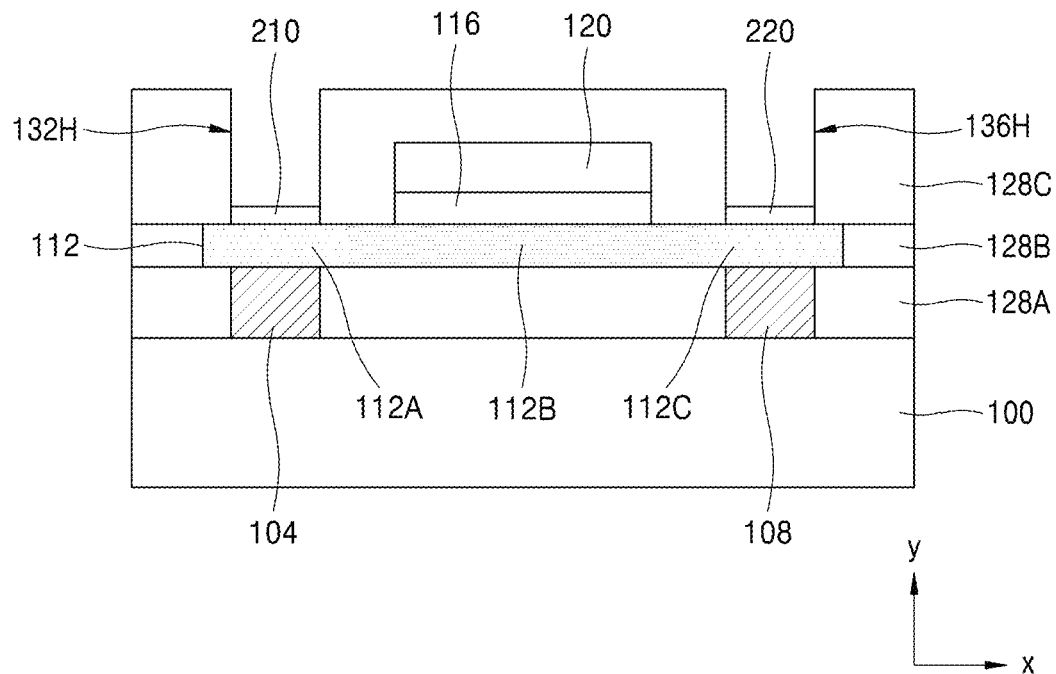

In some examples, before forming the first and second conductive plugs 132 and 136, as shown in FIG. 26, a portion of each of the first and second via holes 132H and 136H may be filled by forming the first and second buffer layers 210 and 220 covering the first and third regions 112A and 112C exposed through the first and second via holes 132H and 136H. Thereafter, the remainder of the first and second via holes 132H and 136H may be filled with the first and second conductive plugs 132 and 136. The first and second buffer layers 210 and 220 may include a material having a low oxygen reactivity than the first and second metal layers 14 and 18.

Figure 27:
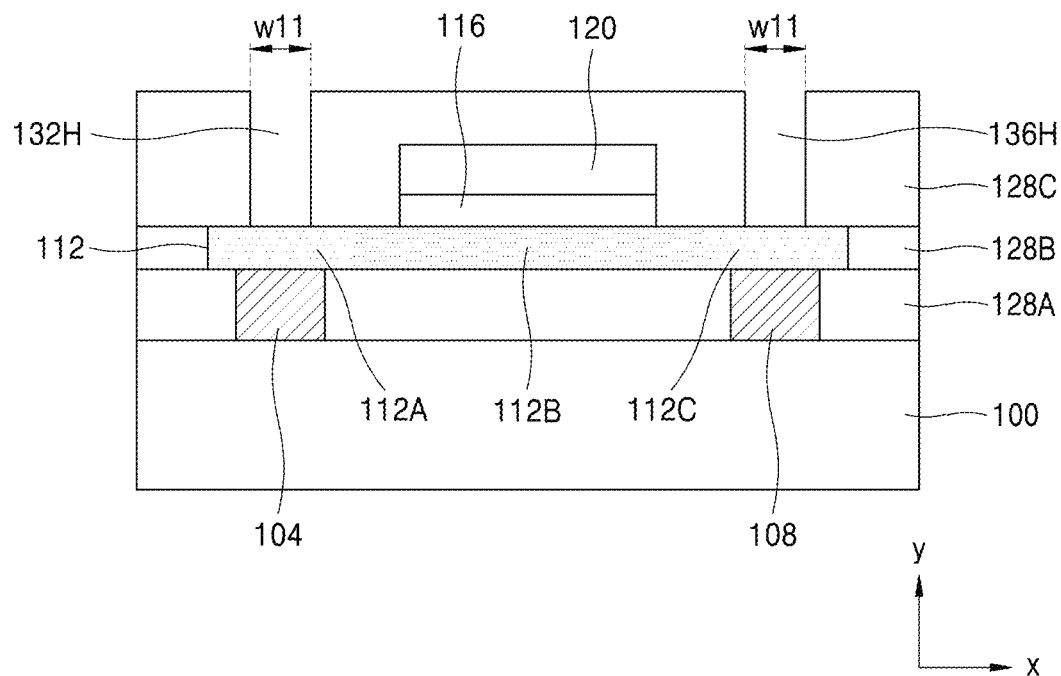

In some examples, as shown in FIG. 27, a width w11 of the first and second via holes 132H and 136H may be formed to be less than a width of the first and second compound layers 104 and 108. Accordingly, a width of the first and second conductive plugs 132 and 136 may be formed less than the width of the first and second compound layers 104 and 108. An opposite case is also possible.

Figure 28:
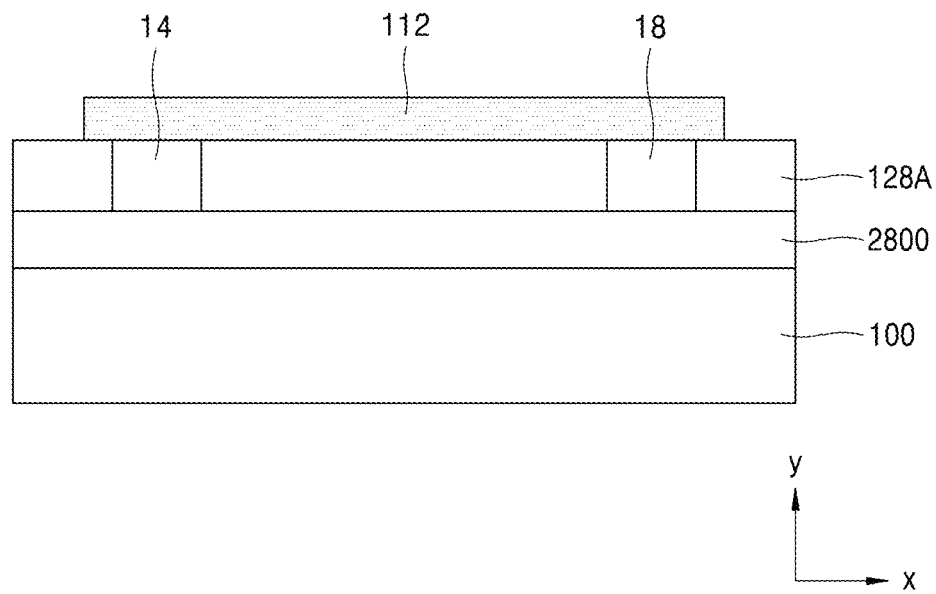

In some examples, as shown in FIG. 28, after forming an insulating layer 2800 between the substrate 100 and the first and second metal layers 14 and 18, the first and second metal layers 14 and 18 may be formed on the insulating layer 2800 and a subsequent process may be performed. In this case, the substrate 100 may be a conductive substrate. In some examples, the insulating layer 2800 may include an oxide layer or a nitride layer having insulating properties, and may include other material layers having insulating properties.

Figure 29:
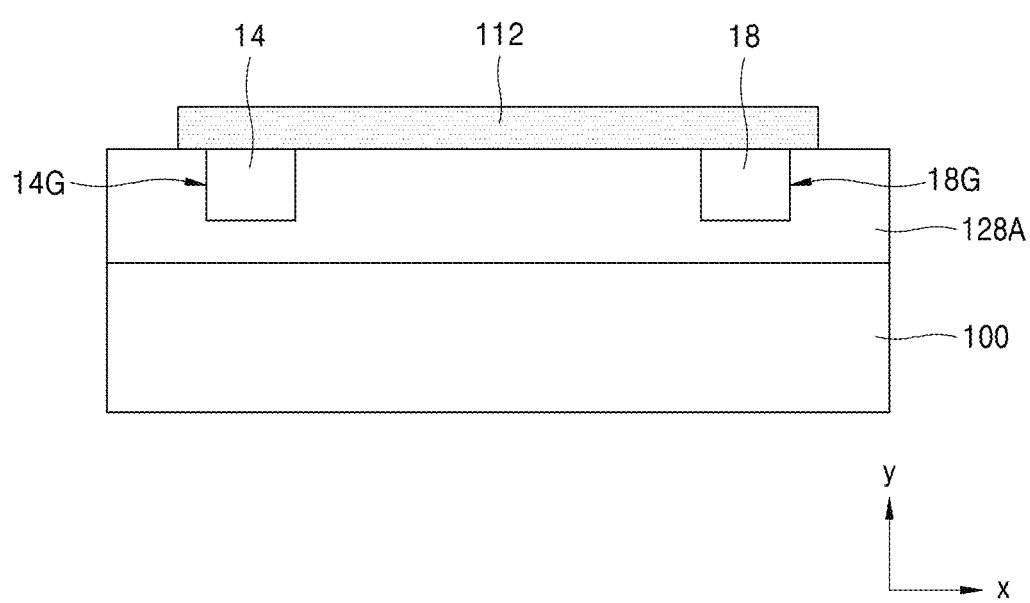

In some examples, as shown in FIG. 29, the first interlayer insulating layer 128A may be formed ahead on the substrate 100. Next, first and second grooves 14G and 18G are formed at locations corresponding to the first and second metal layers 14 and 18 of the first interlayer insulating layer 128A, and then, the first and second grooves 14G and 18G may be filled with the first and second metal layers 14 and 18, respectively. As a result, the first and second metal layers 14 and 18 are separated from the substrate 100. Thereafter, a process of forming the channel layer 112 and subsequent processes may be performed. In FIG. 29, the substrate 100 may be a conductive substrate. The examples of FIGS. 26 to 29 may be combined with each other. Also, in the manufacturing method described above, gate spacers 510 may be formed on side surfaces of the gate stack 116+120 as shown in FIGS. 5 to 8.

FIGS. 30 to 34 relate to a method of manufacturing an oxide semiconductor transistor according to some example embodiments, and show a method of manufacturing a transistor including a bottom gate structure.

Figure 30:
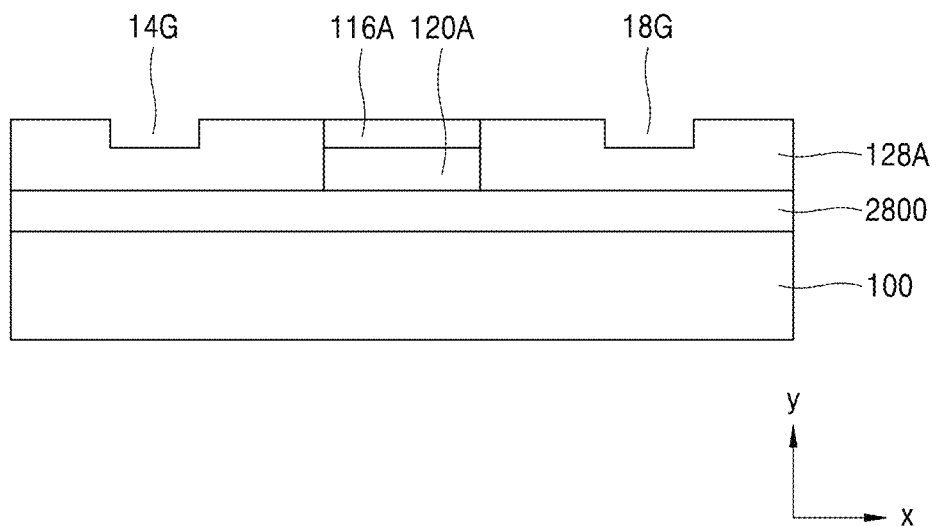

First, referring to FIG. 30, an insulating layer 2800 is formed on a substrate 100. The substrate 100 may be an insulating substrate or include an insulating substrate. A first gate electrode 120A and a first gate insulating layer 116A are sequentially formed on the insulating layer 2800. Next, a first interlayer insulating layer 128A is formed on the insulating layer 2800 around the first gate electrode 120A. The first interlayer insulating layer 128A may be formed to cover an entire upper surface of the insulating layer 2800 around the first gate electrode 120A. A height of an upper surface of the first interlayer insulating layer 128A may be the same as a height of an upper surface of the first gate insulating layer 116A. The first interlayer insulating layer 128A of this type may be formed by planarizing the upper surface of the first interlayer insulating layer 128A until the first gate insulating layer 116A is exposed after forming the first interlayer insulating layer 128A covering a gate stack 120A+116A on the insulating layer 2800. Next, first and second grooves 14G and 18G separated from each other are formed in the first interlayer insulating layer 128A. The gate stack 120A+116A is between the first groove 14G and the second groove 18G. Bottoms of the first and second grooves 14G and 18G are separated from the insulating layer 2800. Because the first and second grooves 14G and 18G are regions filled with the metal layers 14 and 18, the first and second grooves 14G and 18G may be formed in consideration of filling with the metal layers 14 and 18.

Figure 31:
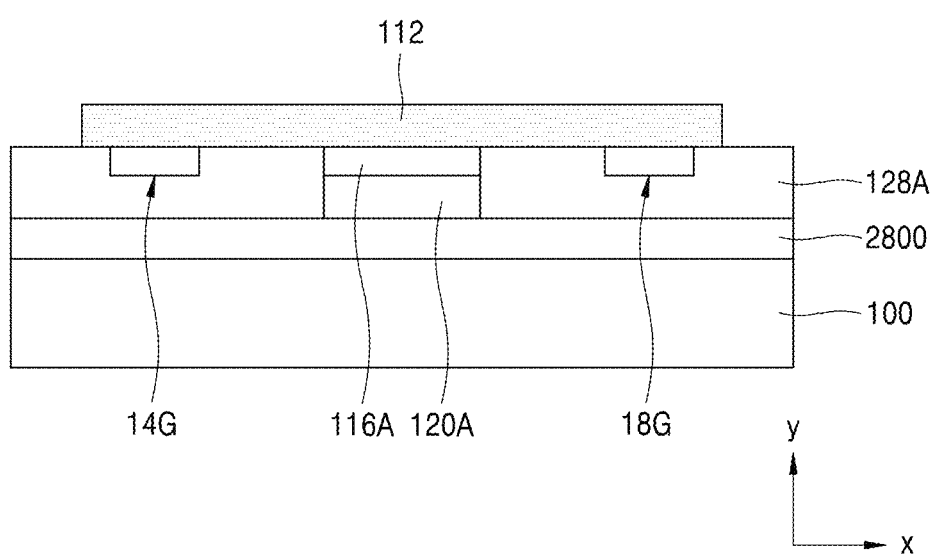

Next, as shown in FIG. 31, the first groove 14G is filled with the first metal layer 14, and the second groove 18G is filled with the second metal layer 18. Next, Next, a channel layer 112 contacting the first and second metal layers 14 and 18 and the first gate insulating layer 116A is formed on the first interlayer insulating layer 128A. The channel layer 112 may cover the entire first and second metal layers 14 and 18 and the entire first gate insulating layer 116A, and cover the entire first interlayer insulating layer 128A between the first and second metal layers 14 and 18 and the first gate insulating layer 116A.

Figure 32:
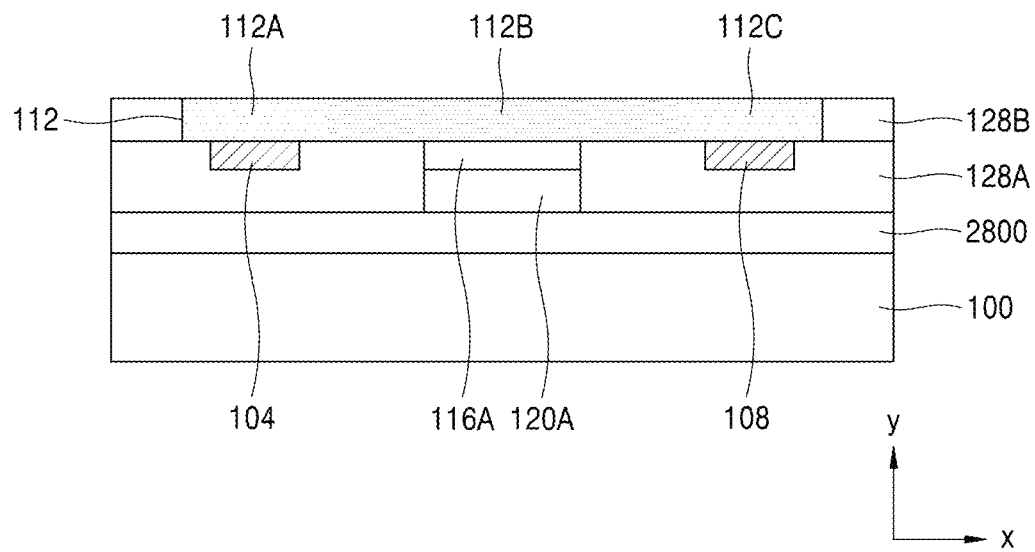
Figure 33:
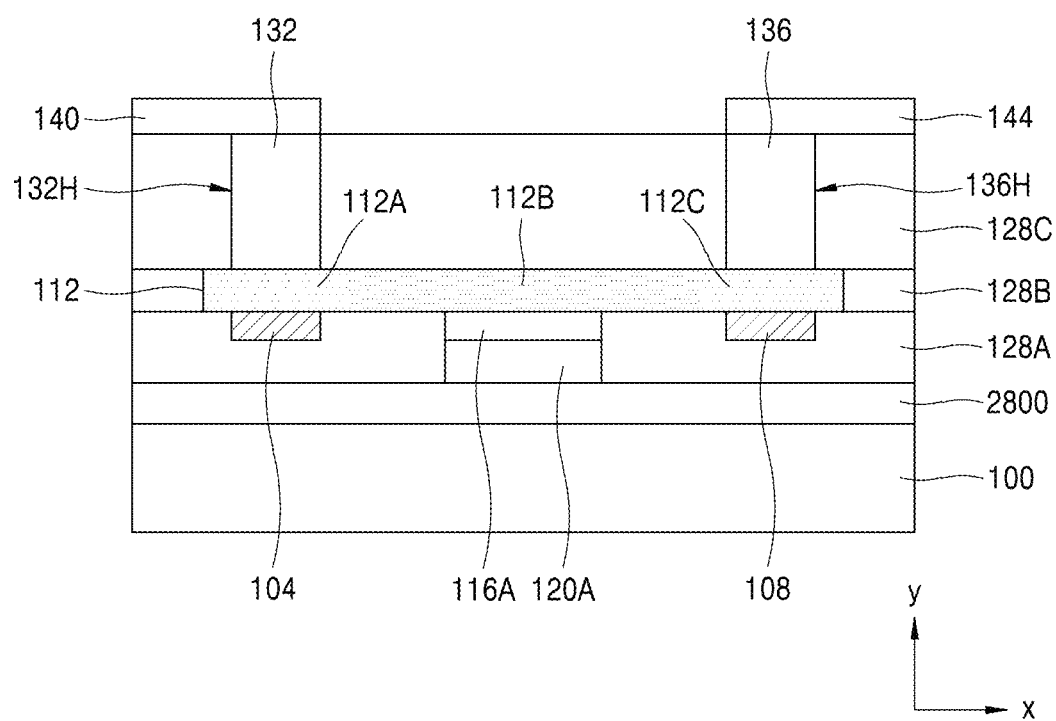

As shown in FIG. 32, first and third regions 112A and 112C having a low oxygen concentration are formed in the channel layer 112 due to the contact between the channel layer 112 and the first and second metal layers 104 and 108, and the first and second metal layers 14 and 18 become first and second compound layers 104 and 108 including oxygen, respectively. After forming the channel layer 112, a process of forming the second interlayer insulating layer 128B around the channel layer 112, and a process of forming the third interlayer insulating layer 128C, first and second via holes 132H and 136H, first and second conductive plugs 132 and 136, and second and third electrodes 140 may be performed in the same manner as the process described with reference to FIGS. 24 and 25. In this way, the tenth transistor 1000T of FIG. 10 may be formed. By applying the examples shown in FIGS. 26 and 27 to the above-described method for manufacturing a transistor having a bottom gate structure, various transistors described above may be manufactured.

Figure 34:
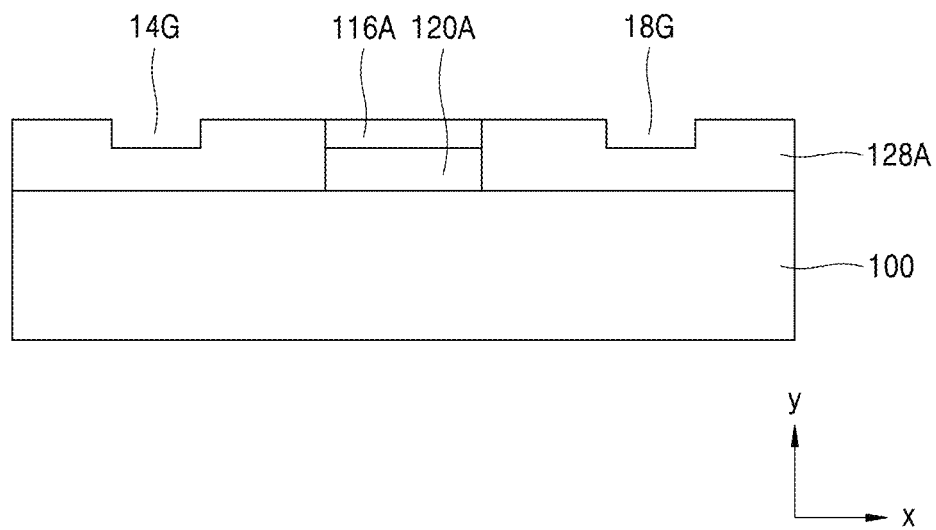

In some examples, as shown in FIG. 34, the gate stack 116A+120A may be formed directly on the substrate 100. In these examples, the substrate 100 may be a conductive substrate and may serve as an electrode wiring for applying a voltage to the gate electrode 120A.

Alternatively, as described with reference to FIG. 20, in order to manufacture or fabricate a transistor including a structure in which the first and second compound layers 104 and 108 are on the channel layer 112, and first and second conductive plugs 132 and 136 are located under the channel layer 112, in the methods described above, a conductive layer serving as the first and second conductive plugs 132 and 136 may be formed at the locations of the first and second metal layers 14 and 18, and the first and second via holes 132H and 136H may be filled with the first and second metal layers 14 and 18, respectively. This case may indicate that the first and second conductive plugs 132 and 136 are formed earlier than the channel layer 112 and the first and second metal layers 14 and 18 are formed later than the channel layer 112. In this case, the first and second conductive plugs 132 and 136 may include a material having a less oxygen reactivity than the first and second metal layers 14 and 18, and accordingly, the first and second conductive plugs 132 and 136 may not react with oxygen of the channel layer 112. According to some examples, in the manufacturing method described above, the first metal layer 14 may be formed as a single layer or multiple layers, and the second metal layer 18 may also be formed as a single layer or multiple layers. Also, a dual gate may be formed by sequentially forming an additional gate electrode and a gate insulating layer under the channel layer 112 in the manufacturing method described with reference to FIGS. 21 to 25, or by sequentially forming an additional gate insulating layer and a gate electrode on the channel layer 112 in the manufacturing method described with reference to FIGS. 30 to 33. As a result, various transistors described above may be formed.

Figure 35:
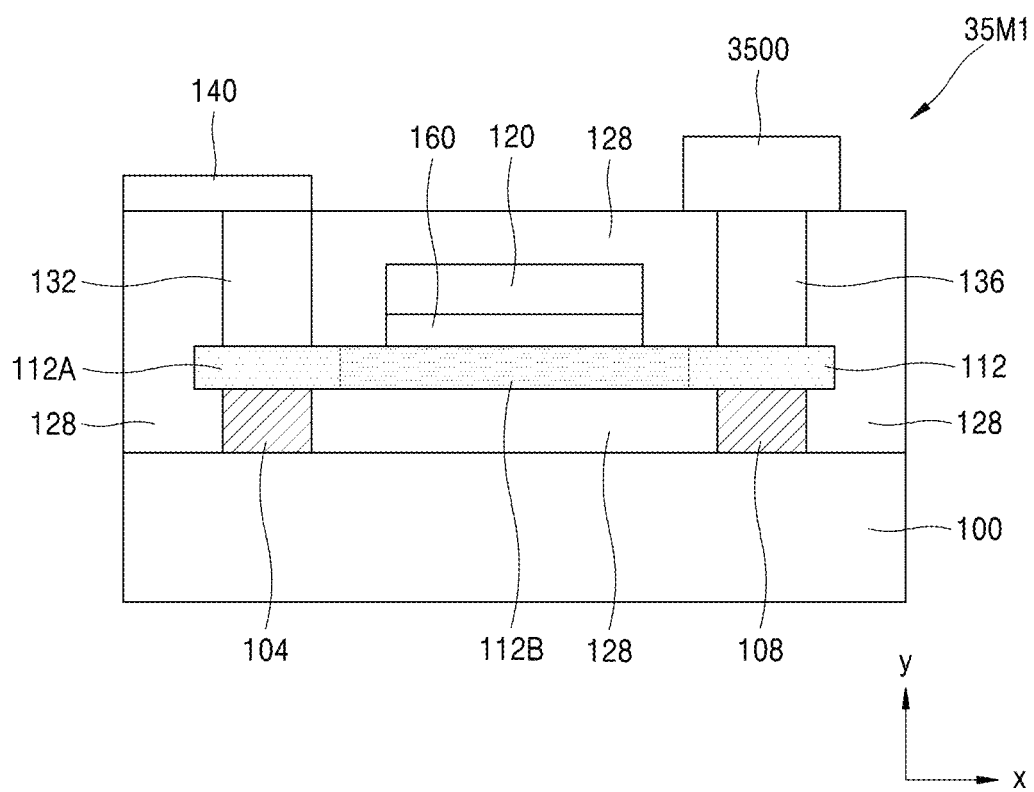
FIG. 35 is a cross-sectional view showing a memory device (memory cell) in which one of the oxide semiconductor transistors shown in FIGS. 1 to 17 are combined with a data storage element.

FIG. 35 shows a memory device 35M1 using the transistor described above as a switching device and including a data storage device connected to the switching device. In some examples, of the transistors described above, the first transistor 100T of FIG. 1 may be used as a switching device.

Referring to FIG. 35, the memory element 35M1 includes a data storage element 3500 on the interlayer insulating layer 128. The data storage element 3500 may cover the entire upper surface of the second conductive plug 136 and may contact/directly contact the upper surface thereof. The data storage element 3500 may include at least one of a capacitor, a ferroelectric capacitor, a magnetic tunnel junction (MTJ) cell, or a memristor, but is not limited thereto. The memory device 35M1 may be a volatile memory device, such as DRAM, and/or a nonvolatile memory device, such as at least one of an FRAM, MRAM, or ReRAM depending on the data storage element 3500.

Figure 36:
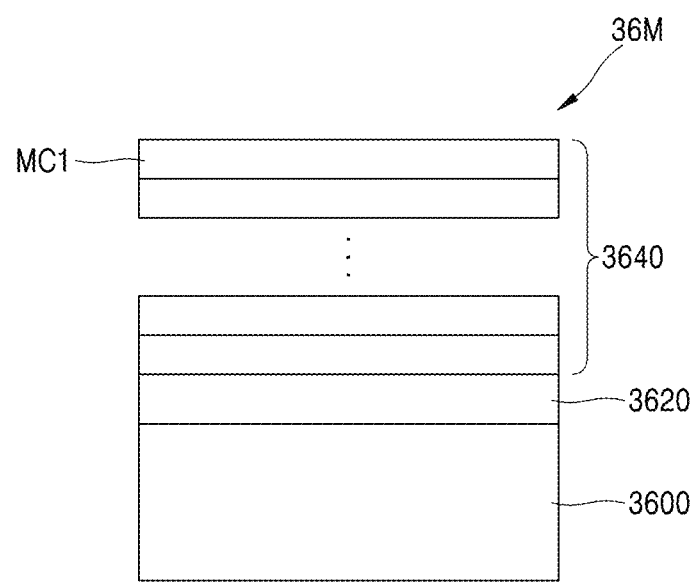
FIG. 36 is a cross-sectional view illustrating a memory device including a memory cell array in which two or more memory device (memory cell) of FIG. 35 are vertically stacked.

FIG. 36 shows a memory device 36M in which a plurality of memory devices 35M1 of FIG. 35 are vertically stacked.

Referring to FIG. 36, a memory logic layer 3620 configured to control an operation of the memory device 36M is arranged on a substrate 3600, and a memory cell array 3640 is provided on the memory logic layer 3620. The memory cell array 3640 includes a plurality of memory cells MC1 vertically stacked. In some examples, the memory cell MC1 may be the memory element 35M1 of FIG. 35.

As opposed to the first transistor 100T, there may not be a second compound layer that contacts/directly contacts the channel layer 112 with the channel layer 112 between the third electrode 144 and the second compound layer. For example, there may not be a second compound layer 108.

There may be none, only one, or both buffer layers 210 and 220.

An oxygen concentration and/or an oxygen density in a first region 112A may be less than an oxygen concentration and/or an oxygen density in a second region 112B, and may also be less than an oxygen concentration and/or oxygen density in the third region 112C.

A contact resistance between the first conductive plug 132 and the channel layer 112 may be less than a contact resistance between the second conductive plug 136 and the channel layer 112.

The channel layer of the disclosed oxide semiconductor transistor includes regions having different oxygen concentrations or oxygen contents. For example, a portion of the channel layer contacting the source and/or drain electrodes may not contain oxygen or may have an oxygen concentration less than other portions of the channel layer. In order to obtain such an oxygen concentration distribution of the channel layer, a metal layer including a metal having high oxygen reactivity may be formed under portions of the channel layer contacting the source and drain electrodes in a process of manufacturing a transistor. Due to the channel layer, it may be possible to prevent or reduce the likelihood of and/or impact from the increase in contact resistance between the source and/or drain electrodes and the channel layer while shifting a threshold voltage Vth from negative (−) to positive (+). For example, a contact resistance between the source and/or drain electrodes and the channel layer may be maintained low while maintaining the threshold voltage as a positive voltage. Accordingly, in the case of a memory device including such an oxide semiconductor transistor as a switching device, an operation speed may be improved.

It should be understood that example embodiments described herein should be considered in a descriptive sense only and not for purposes of limitation. Descriptions of features or aspects within each embodiment should typically be considered as available for other similar features or aspects in other embodiments. For example, some example embodiments may include features described with reference to one or more figures, and may also include features described with reference to one or more other figures. While one or more embodiments have been described with reference to the figures, it will be understood by those of ordinary skill in the art that various changes in form and details may be made therein without departing from the spirit and scope as defined by the following claims.

What is claimed is:

1. An oxide semiconductor transistor comprising:
a substrate;
first and second compound layers on the substrate;
a channel layer contacting the first and second compound layers;
a first electrode facing a portion of the channel layer;
a second electrode facing the first compound layer with the channel layer between the first compound layer and the second electrode; and
a third electrode facing the second compound layer with the channel layer between the second compound layer and the third electrode,
wherein, in the channel layer, an oxygen concentration of a region facing the first electrode is greater than that of remaining regions of the channel layer, and
the first and second compound layers include a metal having higher oxygen reactivity compared to an oxygen reactivity of the second and third electrodes.

2. The oxide semiconductor transistor of claim 1, further comprising:
a buffer layer between the channel layer and the second and third electrodes.

3. The oxide semiconductor transistor of claim 1,
wherein the substrate includes an insulating substrate, and the first and second compound layers contact the substrate.

4. The oxide semiconductor transistor of claim 1,
wherein the substrate includes a conductive substrate, and the first and second compound layers are separated from the substrate.

5. The oxide semiconductor transistor of claim 1, further comprising:
an insulating layer between the substrate and the first and second compound layers.

6. The oxide semiconductor transistor of claim 1,
wherein the first and second compound layers are between the channel layer and the substrate.

7. The oxide semiconductor transistor of claim 1,
wherein the channel layer is between the substrate and the first and second compound layers.

8. The oxide semiconductor transistor of claim 7,
wherein the second and third electrodes are between the channel layer and the substrate.

9. The oxide semiconductor transistor of claim 1, further comprising:
a second gate electrode symmetrical to the first electrode with the channel layer between the first electrode and the second gate electrode, wherein
the first electrode includes a first gate electrode.

10. The oxide semiconductor transistor of claim 1, further comprising:
a gate spacer covering side surfaces of the first electrode.

11. The oxide semiconductor transistor of claim 1,
wherein the first and second compound layers include oxygen.

12. An oxide semiconductor transistor comprising:
a substrate;

first and second compound layers on the substrate;
a channel layer contacting the first and second compound layers;
a first electrode facing a portion of the channel layer;
a second electrode facing the first compound layer with the channel layer between the first compound layer and the second electrode; and
a third electrode facing the second compound layer with the channel layer between the second compound layer and the third electrode,
wherein, in the channel layer, an oxygen concentration of a region facing the first electrode is greater than that of remaining regions of the channel layer,
wherein portions of the channel layer contacting the first and second compound layers do not include oxygen in an entire thickness of the portions of the channel layer contacting the first and second compound layers.

13. The oxide semiconductor transistor of claim 1, wherein a thickness of the channel layer is 20 nm or less.

14. The oxide semiconductor transistor of claim 1, wherein the first and second compound layers include multilayers.

15. The oxide semiconductor transistor of claim 1, wherein a gate insulating layer is between the first electrode and the channel layer, and the gate insulating layer extends over the second and third electrodes.

16. The oxide semiconductor transistor of claim 1, wherein each of the second and third electrodes includes a conductive plug and a conductive layer contacting the conductive plug.

17. The oxide semiconductor transistor of claim 1, wherein the channel layer includes an oxide semiconductor layer, and includes a single layer or a multilayer.

18. The oxide semiconductor transistor of claim 1, wherein the metal having higher oxygen reactivity includes at least one of Al, Zn, Ni, Sn, Mg, or Fe.

19. The oxide semiconductor transistor of claim 1, wherein the metal having higher oxygen reactivity includes an alloy including an element having higher oxygen reactivity compared to an oxygen reactivity of the second and third electrodes.

20. The oxide semiconductor transistor of claim 19, wherein the alloy includes a lithium alloy.

* * * * *